(12) United States Patent
Harada

(10) Patent No.: US 12,033,702 B2
(45) Date of Patent: Jul. 9, 2024

(54) SEMICONDUCTOR MEMORY DEVICE

(71) Applicant: KIOXIA CORPORATION, Tokyo (JP)

(72) Inventor: Yoshikazu Harada, Kawasaki Kanagawa (JP)

(73) Assignee: Kioxia Corporation, Tokyo (JP)

( * ) Notice: Subject to any disclaimer, the term of this patent is extended or adjusted under 35 U.S.C. 154(b) by 185 days.

(21) Appl. No.: 17/681,662

(22) Filed: Feb. 25, 2022

(65) Prior Publication Data

US 2023/0021244 A1 Jan. 19, 2023

(30) Foreign Application Priority Data

Jul. 14, 2021 (JP) .................. 2021-116312

(51) Int. Cl.
 *G11C 16/26* (2006.01)
(52) U.S. Cl.
 CPC .................... *G11C 16/26* (2013.01)
(58) Field of Classification Search
 CPC ............ G11C 16/26; G11C 2211/5642; G11C 2211/5643; G11C 11/5628; G11C 11/5642; G11C 16/0483; G11C 16/08; G11C 16/10; G11C 16/32; G11C 16/3459; G11C 16/24
 USPC .................................................. 365/185.18
 See application file for complete search history.

(56) References Cited

U.S. PATENT DOCUMENTS

| | | | |
|---|---|---|---|
| 10,276,248 B1 * | 4/2019 | Lu .......................... | G11C 16/10 |
| 10,289,313 B2 | 5/2019 | Liu et al. | |
| 10,324,789 B2 | 6/2019 | Yang | |
| 2017/0301403 A1 * | 10/2017 | Pang ...................... | G11C 16/08 |
| 2017/0365335 A1 * | 12/2017 | Wang ..................... | G11C 16/08 |
| 2018/0088867 A1 * | 3/2018 | Kaminaga ............... | G06F 13/16 |
| 2020/0118635 A1 | 4/2020 | De Santis | |
| 2021/0005265 A1 * | 1/2021 | Lee ..................... | G11C 16/3468 |
| 2021/0208984 A1 | 7/2021 | Bueb et al. | |
| 2022/0028466 A1 * | 1/2022 | Kim ........................ | G11C 16/10 |

FOREIGN PATENT DOCUMENTS

| | | |
|---|---|---|
| JP | 2010-073275 A | 4/2010 |
| JP | 2017-224370 A | 12/2017 |
| JP | 6274589 B1 | 2/2018 |
| TW | I719653 B | 2/2021 |

* cited by examiner

*Primary Examiner* — Fernando Hidalgo
(74) *Attorney, Agent, or Firm* — Kim & Stewart LLP

(57) ABSTRACT

A semiconductor memory device includes a memory cell array including a plurality of memory cell transistors, a word line connected to a gate of each of the memory cell transistors, a sequencer configured to control an operation of the memory cell array, and an input/output circuit. When the input/output circuit receives a command instructing an operation of continuously reading data of a plurality of pages from the memory cell transistors, the sequencer determines the data of the plurality of pages by continuously applying read voltages corresponding to the plurality of pages to be read, to the word line. In each continuous time period during which the control circuit applies read voltages for determining the data of one of the pages to the word line, the control circuit does not apply any read voltage for determining the data of another one of the pages to the word line.

20 Claims, 23 Drawing Sheets

FIG. 8

| VERIFY TARGET STATE \ NUMBER OF LOOPS | 1 | 2 | 3 | 4 | 5 | 6 | 7 | 8 | 9 | 10 | 11 | 12 | 13 | 14 | 15 | 16 | 17 | 18 | 19 |
|---|---|---|---|---|---|---|---|---|---|---|---|---|---|---|---|---|---|---|---|
| "A" STATE (VfyA) | O | O | O | O | O | O | | | | | | | | | | | | | |
| "B" STATE (VfyB) | | | O | O | O | O | O | O | | | | | | | | | | | |
| "C" STATE (VfyC) | | | | | O | O | O | O | O | O | | | | | | | | | |
| "D" STATE (VfyD) | | | | | | | O | O | O | O | O | O | | | | | | | |
| "E" STATE (VfyE) | | | | | | | | | O | O | O | O | O | O | | | | | |
| "F" STATE (VfyF) | | | | | | | | | | | O | O | O | O | O | O | | | |
| "G" STATE (VfyG) | | | | | | | | | | | | | | O | O | O | O | O | O |

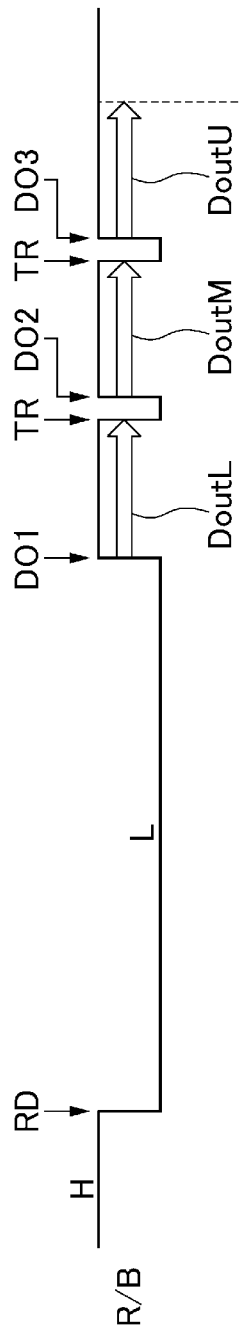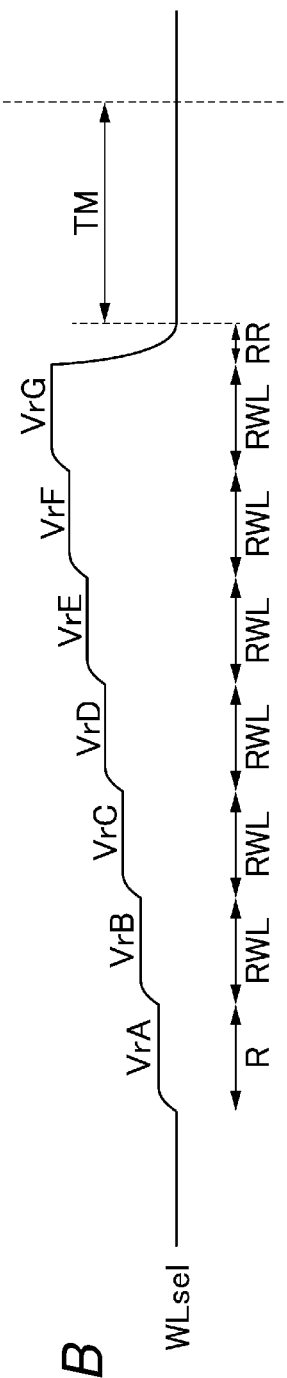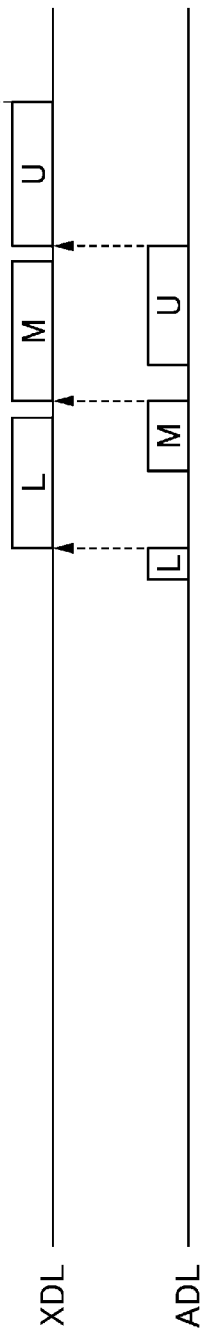

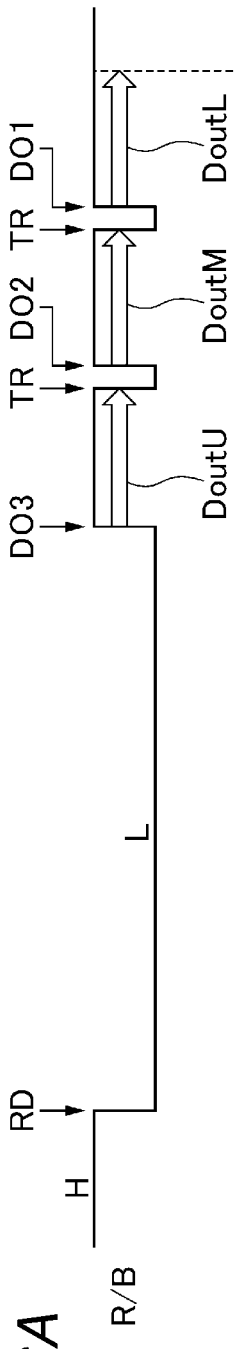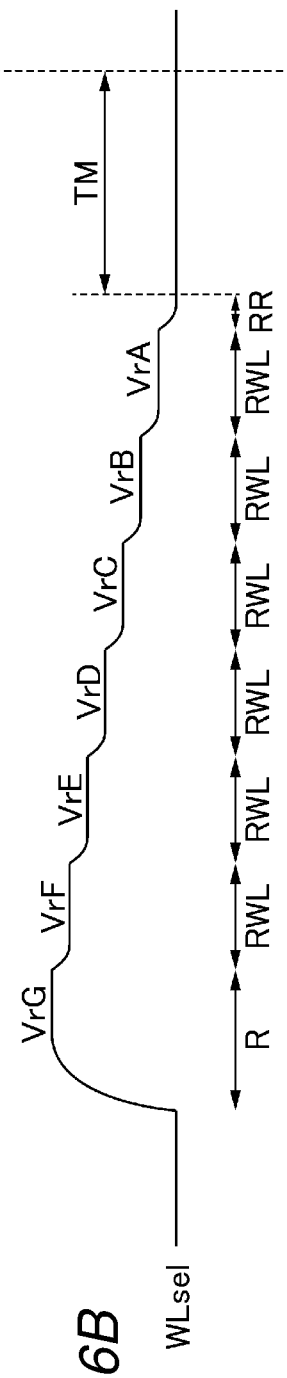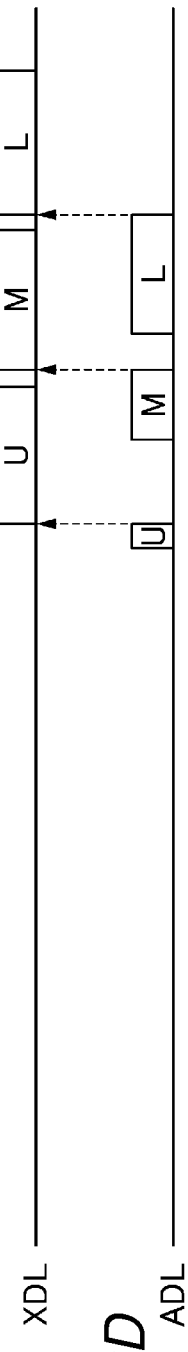
FIG. 16A
FIG. 16B
FIG. 16C
FIG. 16D

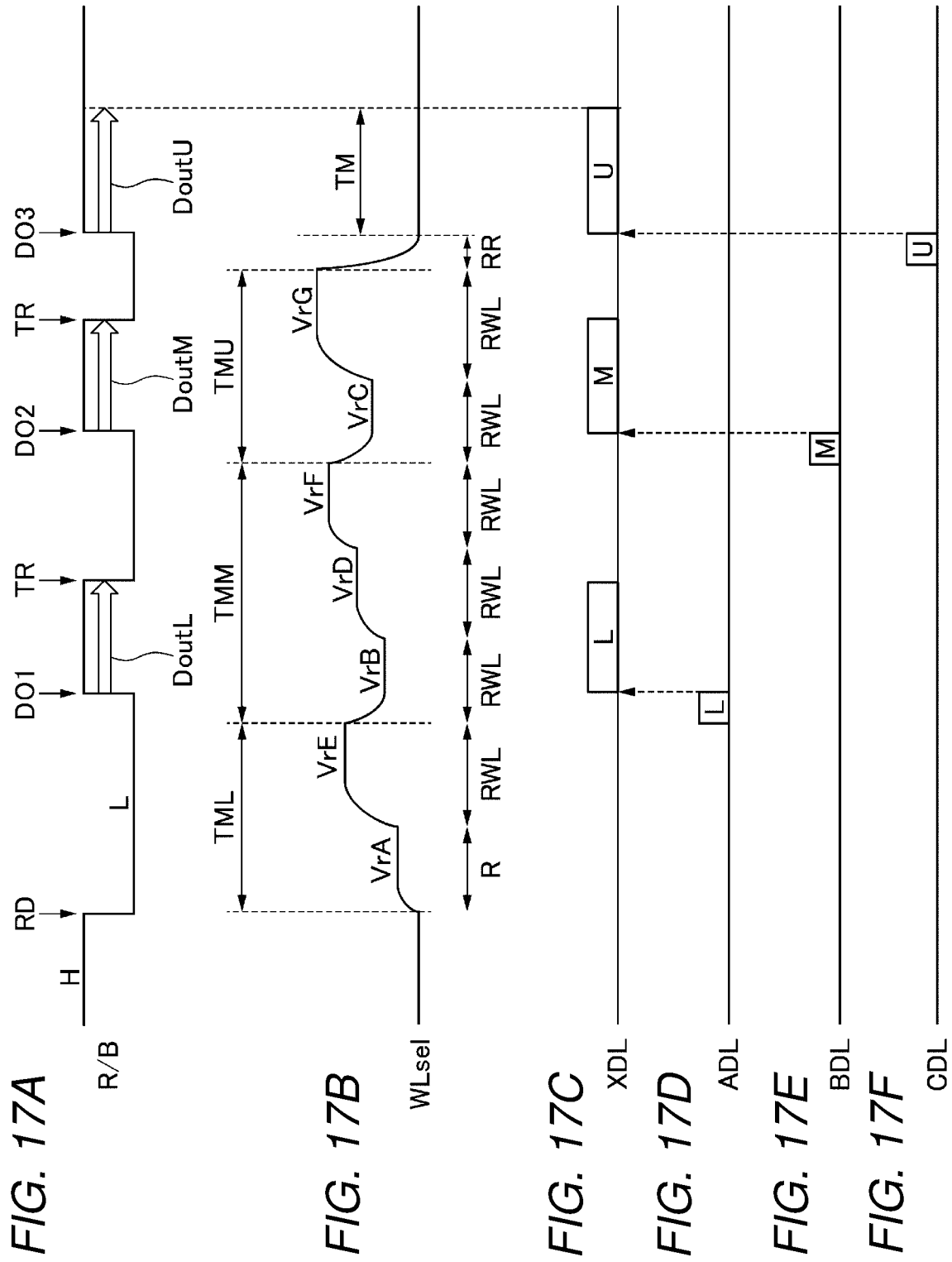

FIG. 18A

NORMAL READ

| CORE OPERATION | Dout OPERATION |
|---|---|

FIG. 18B

CACHE READ

| CORE OPERATION | Dout OPERATION |
|---|---|

FIG. 18C

SEQUENTIAL READ (COMPARATIVE EXAMPLE)

| CORE OPERATION | Dout OPERATION |
|---|---|

FIG. 18D

SEQUENTIAL READ (EMBODIMENT)

| CORE OPERATION | Dout OPERATION |
|---|---|

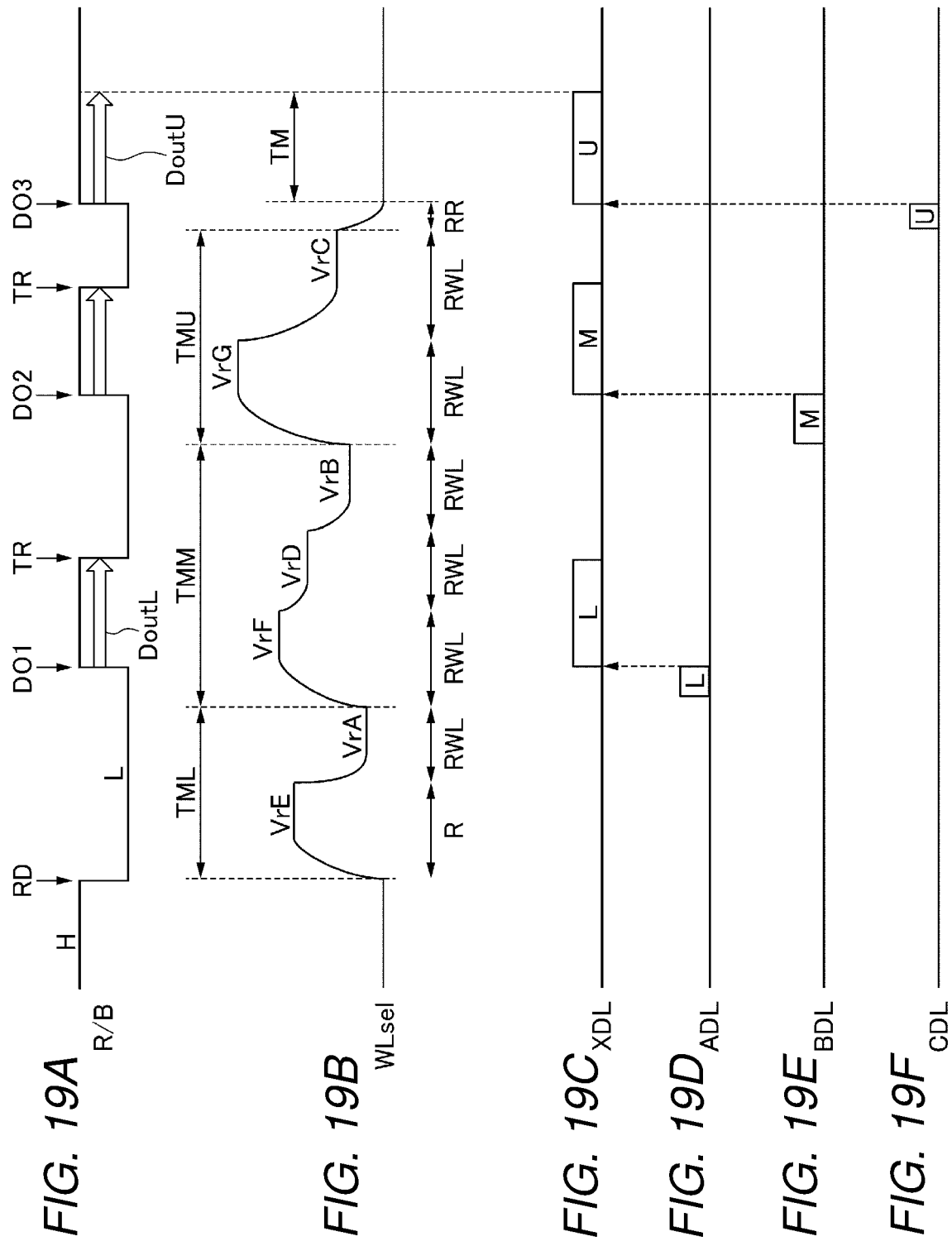

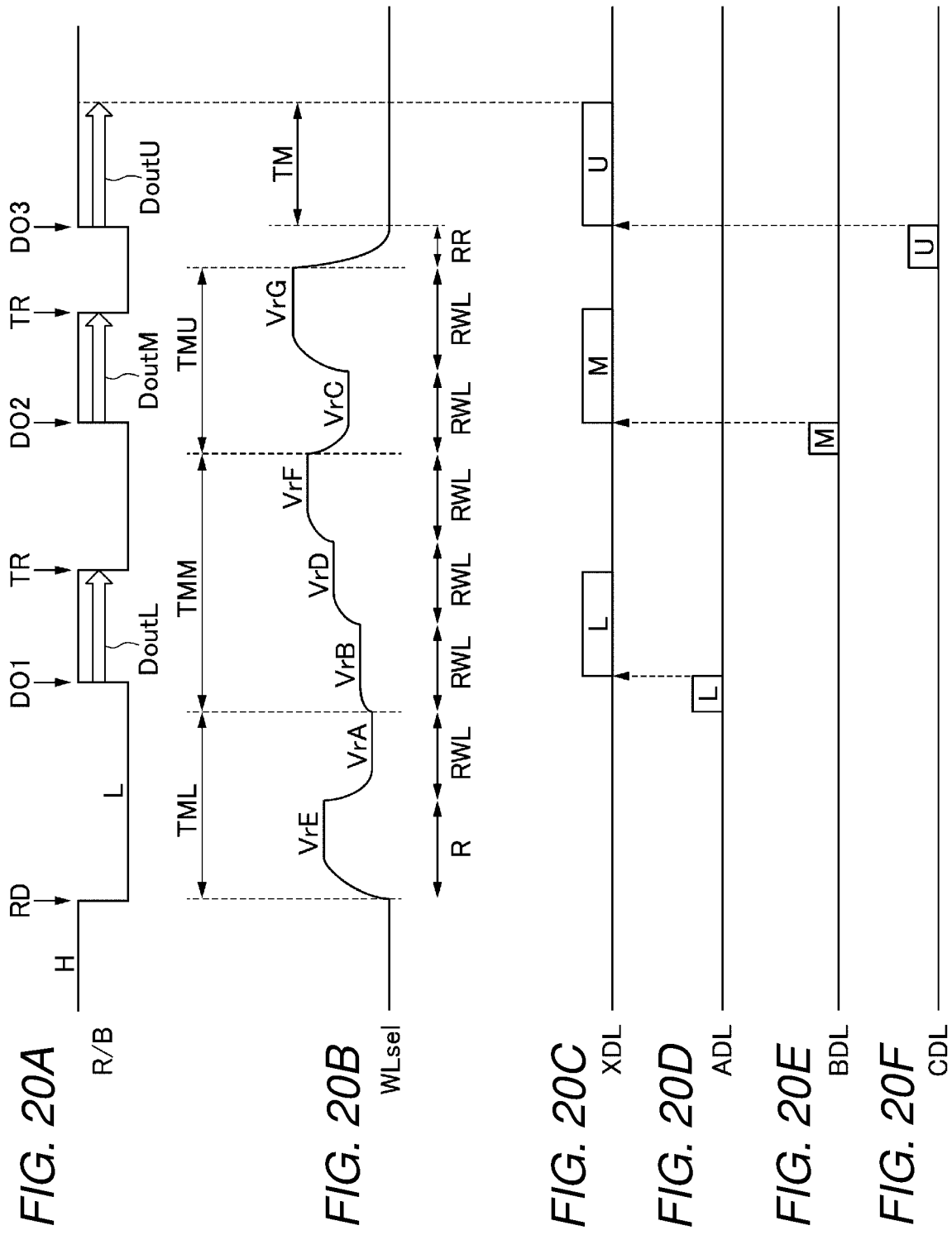

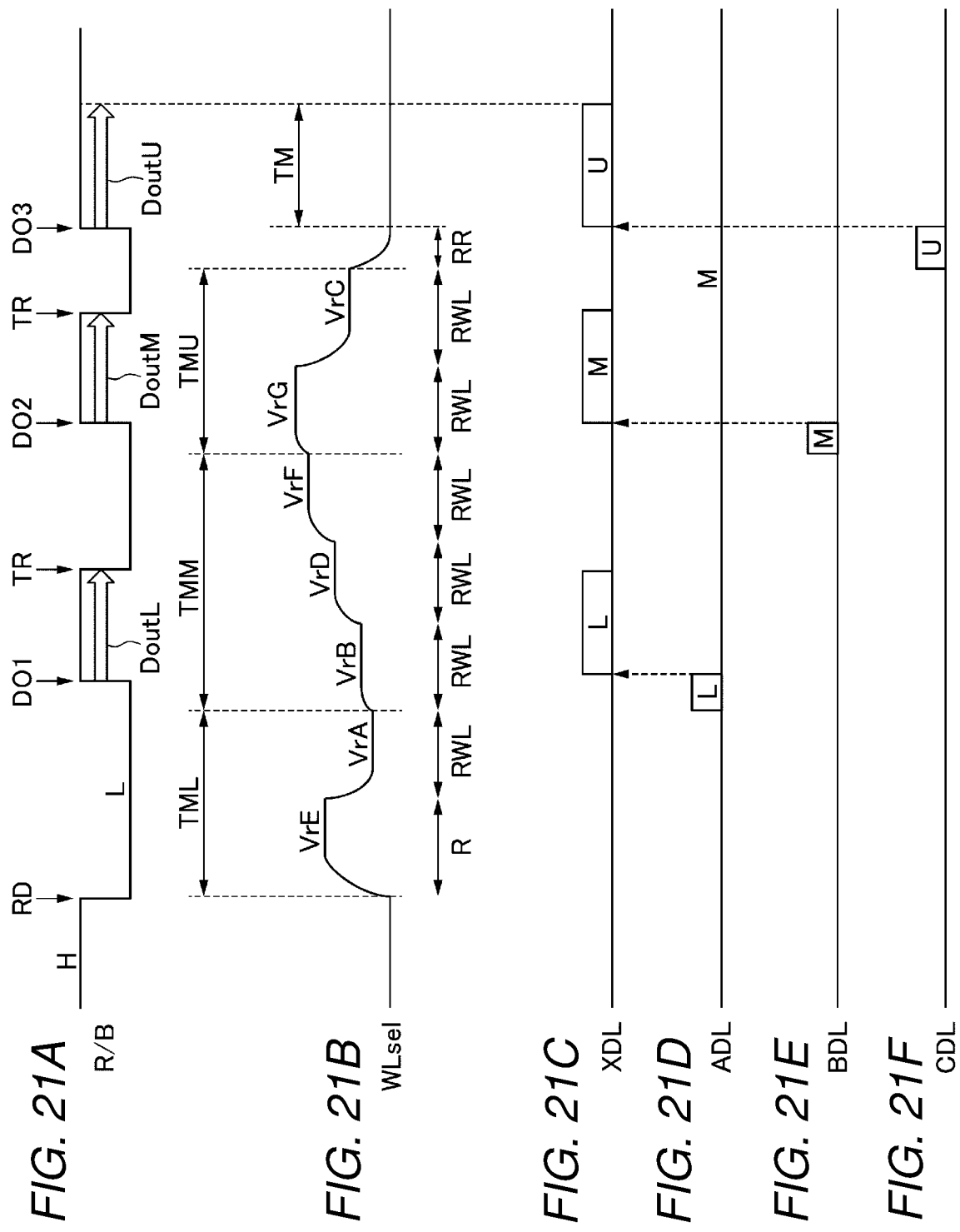

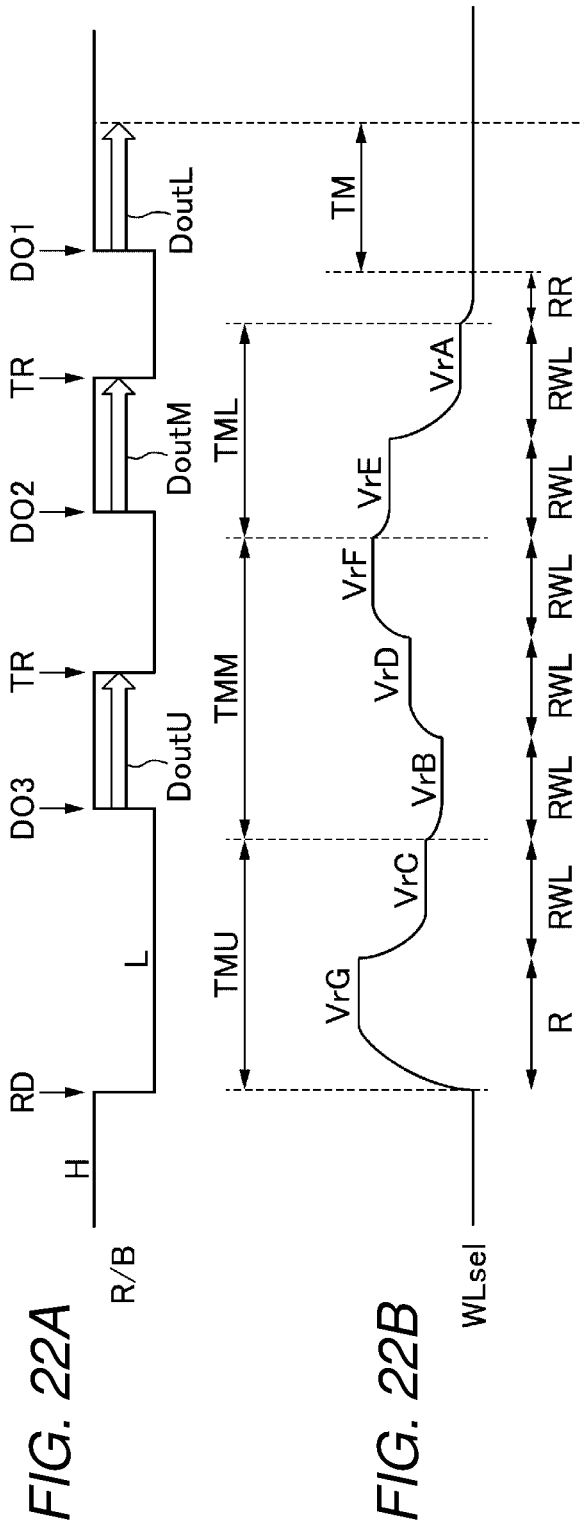

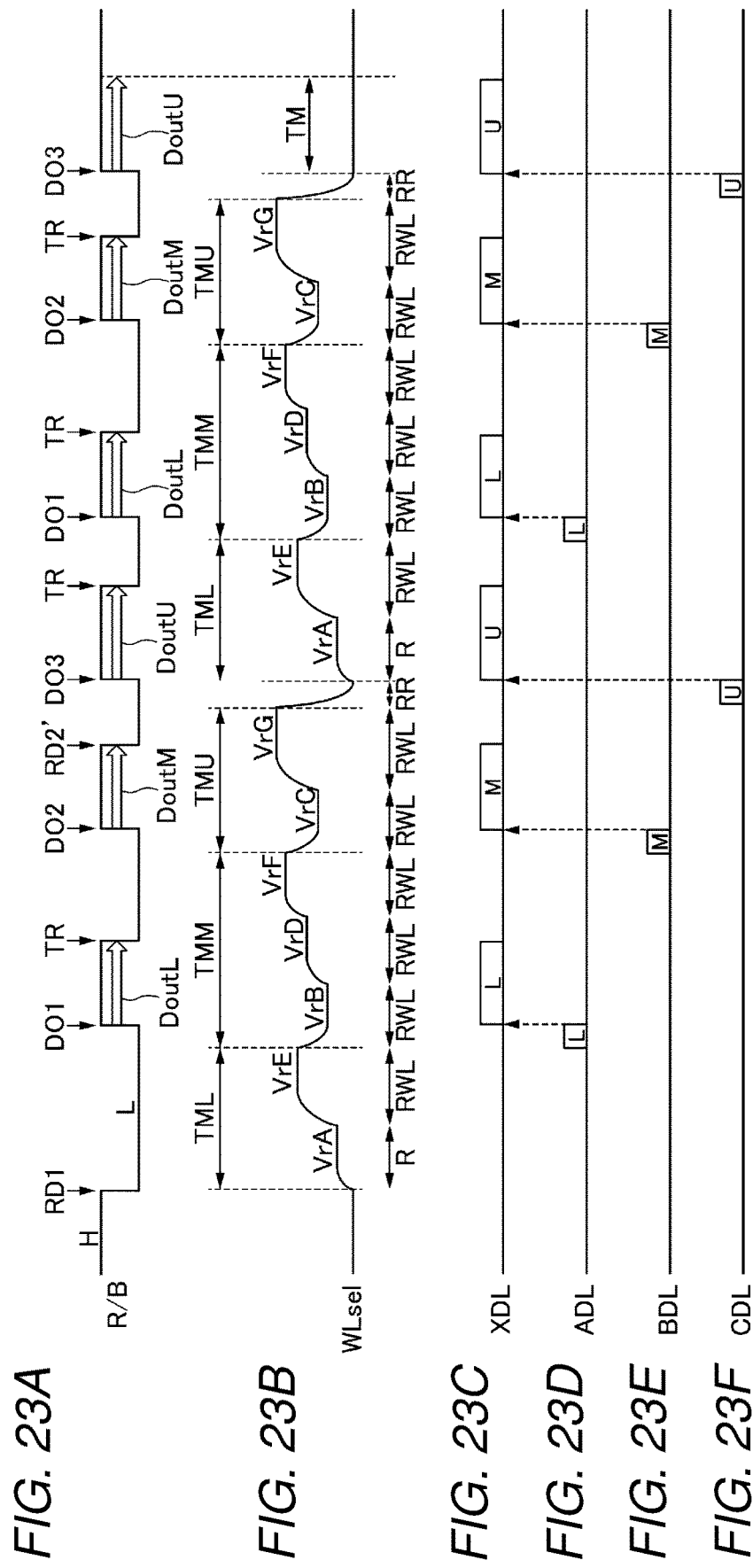

SEMICONDUCTOR MEMORY DEVICE

CROSS-REFERENCE TO RELATED APPLICATION(S)

This application is based upon and claims the benefit of priority from Japanese Patent Application No. 2021-116312 filed Jul. 14, 2021, the entire contents of which are incorporated herein by reference.

FIELD

Embodiments described herein relate generally to a semiconductor memory device.

BACKGROUND

A semiconductor memory device such as a NAND-type flash memory includes a plurality of memory cell transistors for storing data. A set of 1-bit data stored in the plurality of memory cell transistors is called a "page". In recent years, it has become common to store data including a plurality of bits in each memory cell transistor. That is, it has become common to store data for a plurality of pages in a memory cell transistor.

DESCRIPTION OF THE DRAWINGS

FIG. 8 is a diagram illustrating a relationship between the number of loops and a verify operation during the write operation.

FIGS. 15A to 15D are diagrams illustrating a voltage change of each wiring when sequential read of a comparative example is performed.

FIGS. 16A to 16D are diagrams illustrating a voltage change of each wiring when sequential read of another comparative example is performed.

FIGS. 17A to 17F are diagrams illustrating a voltage change of each wiring when sequential read according to the first embodiment is performed.

FIGS. 18A to 18D are diagrams illustrating the time required for the entire read operation.

FIGS. 19A to 19F are diagrams illustrating a voltage change of each wiring when sequential read according to a second embodiment is performed.

FIGS. 20A to 20F are diagrams illustrating a voltage change of each wiring when sequential read according to a third embodiment is performed.

FIGS. 21A to 21F are diagrams illustrating a voltage change of each wiring when sequential read according to a fourth embodiment is performed.

FIGS. 22A to 22F are diagrams illustrating a voltage change of each wiring when sequential read according to a fifth embodiment is performed.

FIGS. 23A to 23F are diagrams illustrating a voltage change of each wiring when sequential read according to a modification of the embodiments is performed.

DETAILED DESCRIPTION

Figure 1:
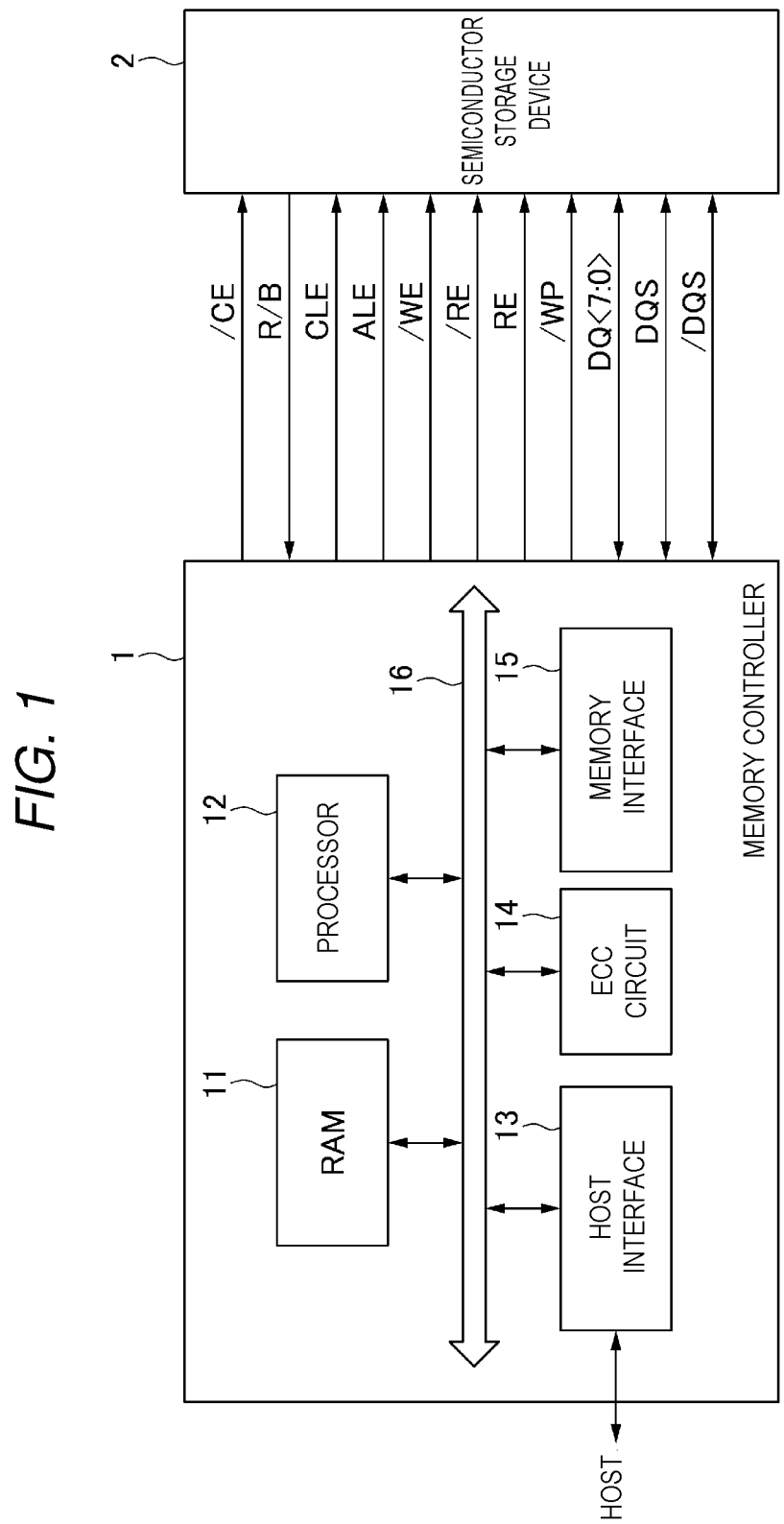
FIG. 1 is a block diagram illustrating a configuration example of a memory system according to a first embodiment.

Embodiments provide a semiconductor memory device capable of reading a plurality of pages of data at a high speed.

In general, according to one embodiment, a semiconductor memory device includes a memory cell array including a plurality of memory cell transistors, a word line connected to the gate of the memory cell transistor, a control circuit that controls the operation of the memory cell array, and an input circuit. When the input circuit receives a command instructing an operation of continuously reading data on a plurality of pages from the memory cell transistors, the control circuit determines the data on the plurality of pages by continuously applying read voltages corresponding to the plurality of pages to be read, to the word line. In each continuous time period during which the control circuit applies read voltages for determining the data of one of the pages to the word line, the control circuit does not apply any read voltage for determining the data of another one of the pages to the word line.

Hereinafter, the present embodiment will be described with reference to the accompanying drawings. In order to facilitate understanding of the description, the same components are designated by the same reference numerals if possible in each drawing, and duplicate descriptions thereof are omitted.

A first embodiment will be described. A semiconductor memory device 2 according to the present embodiment is a non-volatile memory device configured as a NAND-type flash memory. FIG. 1 illustrates a configuration example of a memory system including the semiconductor memory device 2 in a block diagram. This memory system includes a memory controller 1 and the semiconductor memory device 2. Further, although a plurality of semiconductor memory devices 2 is actually provided in the memory system of FIG. 1, only one of them is illustrated in FIG. 1. The specific configuration of the semiconductor memory device 2 will be described later. This memory system may be connected to a host (not illustrated). The host is, for example, an electronic device such as a personal computer or a mobile terminal.

The memory controller 1 controls the writing of data to the semiconductor memory device 2 according to a write request from the host. Further, the memory controller 1 controls the reading of data from the semiconductor memory device 2 according to a read request from the host.

Between the memory controller 1 and the semiconductor memory device 2, a chip enable signal /CE, a ready busy signal R/B, a command latch enable signal CLE, an address latch enable signal ALE, a write enable signal /WE, read enable signals /RE and RE, a write protect signal /WP, a signal DQ<7:0>, which contains data, and data strobe signals DQS and /DQS are each transmitted and received.

The chip enable signal /CE is a signal that enables the semiconductor memory device 2. The ready busy signal R/B is a signal indicating whether the semiconductor memory device 2 is in a ready state or a busy state. The "ready state" refers to a state in which an external command can be accepted. The "busy state" refers to a state in which an external command cannot be accepted. The command latch enable signal CLE is a signal indicating that the signal DQ <7:0> contains a command. The address latch enable signal ALE is a signal indicating that the signal DQ<7:0> contains an address. The write enable signal /WE is a signal to instruct the semiconductor memory device 2 that the signal DQ<7:0> is to be received into the semiconductor memory device 2. In the single data rate (SDR) mode, the signal DQ<7:0> as a command, an address, or data is transmitted to the semiconductor memory device 2 at the rising edge of the signal /WE. Further, in the double data rate (DDR) mode, the signal DQ<7:0> as a command or an address is transmitted to the semiconductor memory device 2 at the rising edge of the signal /WE. Each time a command, an address, or data is transmitted by the memory controller 1, assertion is made on the signal /WE.

The read enable signal /RE is a signal for the memory controller 1 to read data from the semiconductor memory device 2. The signal RE is a complementary signal of the signal /RE. These signals are used, for example, to control an operation timing of the semiconductor memory device 2 when outputting the signal DQ<7:0>. More specifically, in the single data rate mode, the semiconductor memory device 2 is instructed to output the signal DQ<7:0> as data to the semiconductor memory device 2 at the falling edge of the signal /RE. Further, in the double data rate mode, the semiconductor memory device 2 is instructed to output the signal DQ<7:0> as data to the semiconductor memory device 2 at the falling edge and the rising edge of the signal /RE. The write protect signal /WP is a signal for instructing the semiconductor memory device 2 to prohibit data writing and erasing. The signal DQ<7:0> contains data transmitted/received between the semiconductor memory device 2 and the memory controller 1, and includes commands, addresses, and data. The data strobe signal DQS is a signal for controlling the input/output timing of the signal DQ <7:0>. The signal /DQS is a complementary signal of the signal DQS. More specifically, in the double data rate mode, it is instructed to input the signal DQ<7:0> as data to the semiconductor memory device 2 at the falling edge and the rising edge of the signal DQS. Further, the signal DQS is generated based on the falling edge and the rising edge of the signal /RE in the double data rate mode, and output from the semiconductor memory device 2 together with the signal DQ<7:0> as data.

The memory controller 1 includes a RAM 11, a processor 12, a host interface 13, an ECC circuit 14, and a memory interface 15. The RAM 11, the processor 12, the host interface 13, the ECC circuit 14, and the memory interface 15 are connected to each other by an internal bus 16.

The host interface 13 outputs a request received from the host and user data (write data) to the internal bus 16. Further, the host interface 13 transmits the user data read from the semiconductor memory device 2 and a response from the processor 12 to the host.

The memory interface 15 controls a process of writing user data to the semiconductor memory device 2 and a process of reading the user data from the semiconductor memory device 2 based on the instruction of the processor 12.

The processor 12 controls the entire memory controller 1. The processor 12 is, for example, a CPU or an MPU. When receiving a request from the host via the host interface 13, the processor 12 performs a control according to the request. For example, the processor 12 instructs the memory interface 15 to write user data and parity to the semiconductor memory device 2 according to the request from the host. Further, the processor 12 instructs the memory interface 15 to read the user data and parity from the semiconductor memory device 2 according to the request from the host.

The processor 12 determines a storage area (memory area) on the semiconductor memory device 2 for the user data stored in the RAM 11. The user data is stored in the RAM 11 via the internal bus 16. The processor 12 determines the memory area for the page-based data (page data), which is a unit of writing. The user data stored in one page of the semiconductor memory device 2 is also referred to as "unit data" below. The unit data is generally encoded and stored in the semiconductor memory device 2 as a code word. In the present embodiment, coding is optional. The memory controller 1 may store the unit data in the semiconductor memory device 2 without encoding, but FIG. 1 illustrates a configuration in which encoding is performed as a configuration example. When encoding is not performed by the memory controller 1, the page data matches the unit data. Further, one code word may be generated based on one piece of unit data, or one code word may be generated based on the divided data into which the unit data is divided. Also, one code word may be generated using a plurality of pieces of unit data.

The processor 12 determines the memory area of the semiconductor memory device 2 to be written for each unit data. A physical address is assigned to the memory area of the semiconductor memory device 2. The processor 12 manages the memory area to which the unit data is written by using the physical address. The processor 12 designates the determined memory area (e.g., physical address) and instructs the memory interface 15 to write the user data to the semiconductor memory device 2. The processor 12 manages a correspondence between the logical address of the user data (which is a logical address managed by the host) and the physical address. When receiving a read request including a logical address from the host, the processor 12 determines the physical address corresponding to the logical address, designates the physical address, and instructs the memory interface 15 to read the user data.

The ECC circuit 14 encodes the user data stored in the RAM 11 to generate a code word. Further, the ECC circuit 14 decodes the code word read from the semiconductor memory device 2. The ECC circuit 14 detects an error in the data and corrects the error by using, for example, a checksum assigned to the user data.

The RAM 11 temporarily stores the user data received from the host until it is stored in the semiconductor memory device 2, or temporarily stores the data read from the semiconductor memory device 2 until it is transmitted to the host. The RAM 11 is, for example, a general-purpose memory such as an SRAM or a DRAM.

FIG. 1 illustrates a configuration example in which the memory controller 1 separately provides for an ECC circuit 14 and a memory interface 15. However, the ECC circuit 14 may be built in the memory interface 15. Further, the ECC circuit 14 may be built in the semiconductor memory device 2. Each element illustrated in FIG. 1 is not limited to the specific configuration and arrangement thereof illustrated in FIG. 1.

When a write request is received from the host, the memory system of FIG. 1 operates as follows. The processor 12 temporarily stores the data to be written in the RAM 11. The processor 12 reads the data stored in the RAM 11 and inputs it to the ECC circuit 14. The ECC circuit 14 encodes the input data and inputs the code word to the memory interface 15. The memory interface 15 writes the input code word in the semiconductor memory device 2.

When a read request is received from the host, the memory system of FIG. 1 operates as follows. The memory interface 15 inputs the code word read from the semiconductor memory device 2 to the ECC circuit 14. The ECC circuit 14 decodes the input code word and stores the decoded data in the RAM 11. The processor 12 transmits the data stored in the RAM 11 to the host via the host interface 13.

Figure 2:
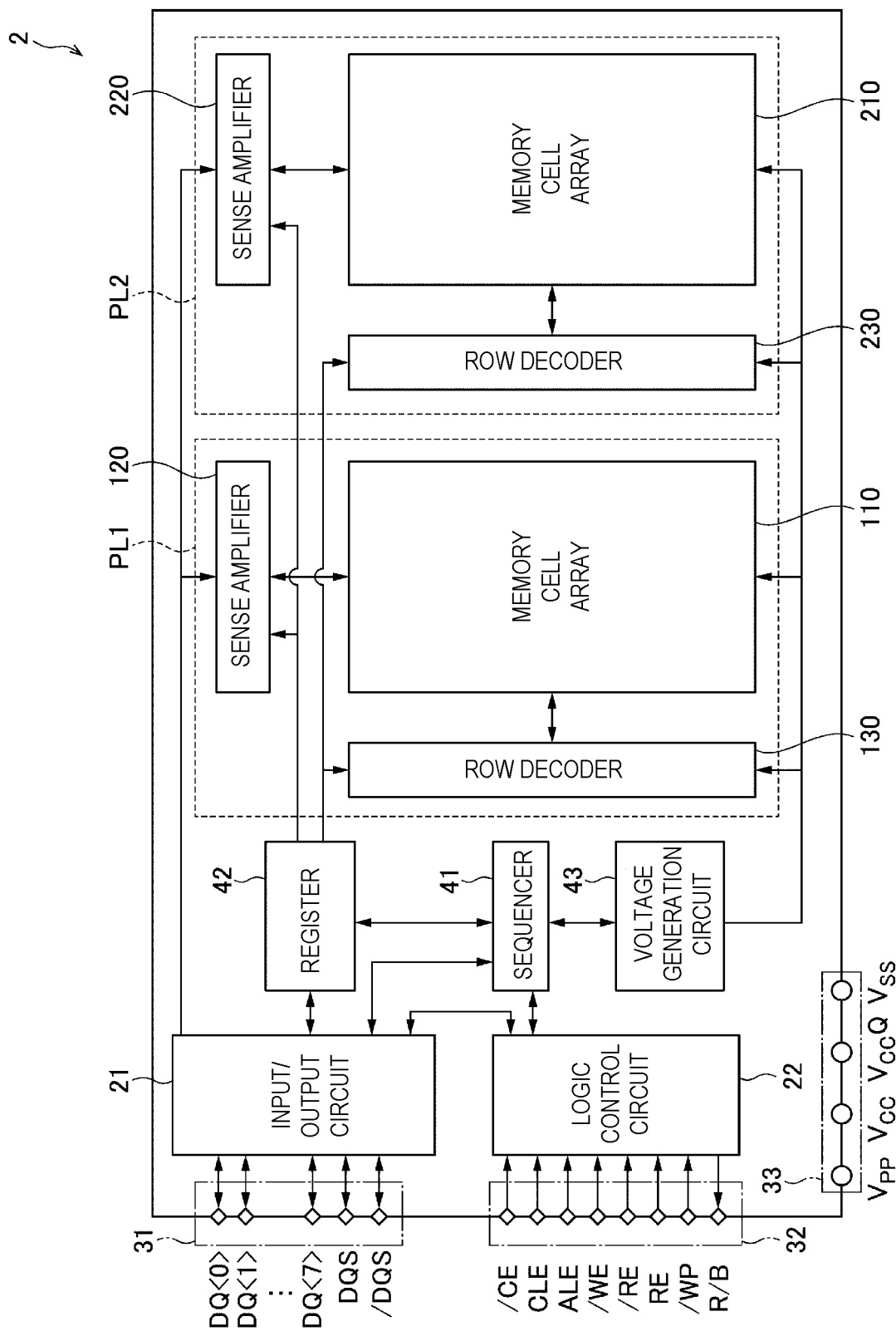
FIG. 2 is a block diagram illustrating the configuration of the semiconductor memory device according to the first embodiment.

The configuration of the semiconductor memory device 2 will be mainly described with reference to FIG. 2. As illustrated in the figure, the semiconductor memory device 2 includes two planes PL1 and PL2, an input/output circuit 21, a logic control circuit 22, a sequencer 41, a register 42, a voltage generation circuit 43, an input/output pad group 31, a logic control pad group 32, and a power input terminal group 33.

The plane PL1 includes a memory cell array 110, a sense amplifier 120, and a row decoder 130. Further, the plane PL2 includes a memory cell array 210, a sense amplifier 220, and a row decoder 230. The configurations of the plane PL1 and the plane PL2 are the same. That is, the configurations of the memory cell array 110 and the memory cell array 210 are the same, the configurations of the sense amplifier 120 and the sense amplifier 220 are the same, and the configurations of the row decoder 130 and the row decoder 230 are the same. The number of planes provided in the semiconductor memory device 2 may be two as in the present embodiment, but may be one or three or more.

The memory cell array 110 and the memory cell array 210 are parts for storing data. Each of the memory cell array 110 and the memory cell array 210 includes a plurality of memory cell transistors associated with word lines and bit lines. The specific configurations of these elements will be described later.

The input/output circuit 21 transmits/receives the signal DQ<7:0> and the data strobe signals DQS and /DQS to and from the memory controller 1. The input/output circuit 21 transfers the command and the address in the signal DQ <7:0> to the register 42. Further, the input/output circuit 21 transmits/receives write data and read data to and from the sense amplifier 120 and the sense amplifier 220. The input/output circuit 21 functions as both an "input circuit" for receiving commands from the memory controller 1 and an "output circuit" for outputting data to the memory controller 1. Instead of such an embodiment, the input circuit and the output circuit may be configured as separate circuits.

The logic control circuit 22 receives a chip enable signal /CE, a command latch enable signal CLE, an address latch enable signal ALE, a write enable signal /WE, read enable signals RE and /RE, and a write protect signal /WP from the memory controller 1. Further, the logic control circuit 22 transfers the ready busy signal R/B to the memory controller 1 to notify the state of the semiconductor memory device 2 to the outside.

Both the input/output circuit 21 and the logic control circuit 22 are configured as a circuit where signals are input/output to and from the memory controller 1. That is, the input/output circuit 21 and the logic control circuit 22 are each an interface circuit of the semiconductor memory device 2.

The sequencer 41 controls the operation of the respective parts such as the planes PL1 and PL2, and the voltage generation circuit 43 based on a control signal input from the memory controller 1 to the semiconductor memory device 2. The sequencer 41 is a control circuit that controls the operation of the memory cell arrays 110 and 210. Both the sequencer 41 and the logic control circuit 22 may be referred to as the control circuit.

The register 42 temporarily stores a command or an address. The register 42 also stores status information indicating the states of the planes PL1 and PL2. The status information is output from the input/output circuit 21 to the memory controller 1 as a state signal in response to a request from the memory controller 1.

The voltage generation circuit 43 generates the voltage required for each of the data write operation, read operation, and erase operation in the memory cell arrays 110 and 210 based on the instruction from the sequencer 41. Such a voltage includes, for example, a voltage such as VPGM, VPASS_PGM, or VPASS_READ applied to the word line WL (to be described later), a voltage applied to the bit line BL (to be described later). The voltage generation circuit 43 may individually apply a voltage to each of the word line WL and the bit line BL so that the plane PL1 and the plane PL2 may operate in parallel with each other.

The input/output pad group 31 is provided with a plurality of terminals (pads) for transmitting and receiving each signal between the memory controller 1 and the input/output circuit 21. Each terminal is individually provided corresponding to each of the signal DQ<7:0> and the data strobe signals DQS and /DQS.

The logic control pad group 32 is provided with a plurality of terminals (pads) for transmitting and receiving each signal between the memory controller 1 and the logic control circuit 22. Each terminal is individually provided corresponding to each of a chip enable signal /CE, a command latch enable signal CLE, an address latch enable signal ALE, a write enable signal /WE, read enable signals RE and /RE, a write protect signal /WP, and a ready busy signal R/B.

The power input terminal group 33 is provided with a plurality of terminals for receiving each voltage necessary for the operation of the semiconductor memory device 2. The voltage applied to each terminal includes power supply voltages Vcc, VccQ, and Vpp, and a ground voltage Vss.

The power supply voltage Vcc is a circuit power supply voltage supplied from the outside as an operating power supply, and is, for example, a voltage of about 3.3 V. The power supply voltage VccQ is, for example, a voltage of 1.2 V. The power supply voltage VccQ is a voltage used for transmitting and receiving signals between the memory controller 1 and the semiconductor memory device 2. The power supply voltage Vpp is a power supply voltage higher than the power supply voltage Vcc, and is, for example, a voltage of 12 V.

When writing data to the memory cell arrays 110 and 210 or erasing the data, a high voltage (VPGM) of about 20 V is required. It is possible to generate a desired voltage rapidly and with low power consumption by boosting the power supply voltage Vpp of about 12 V rather than boosting the power supply voltage Vcc of about 3.3 V by the booster circuit of the voltage generation circuit 43. For example, when the semiconductor memory device 2 is used in an environment where a high voltage cannot be supplied, the power supply voltage Vpp is not supplied. Even when the power supply voltage Vpp is not supplied, the semiconductor memory device 2 may execute various operations as long as the power supply voltage Vcc is supplied. That is, the power supply voltage Vcc is supplied to the semiconductor memory device 2 as standard, and the power supply voltage Vpp is additionally and optionally supplied according to, for example, the usage environment.

The configurations of the planes PL1 and PL2 will be described. As described above, the configurations of the plane PL1 and the plane PL2 are the same. Therefore, in the following, only the configuration of the plane PL1 will be described, and the illustration and description of the configuration of the plane PL2 will be omitted.

Figure 3:
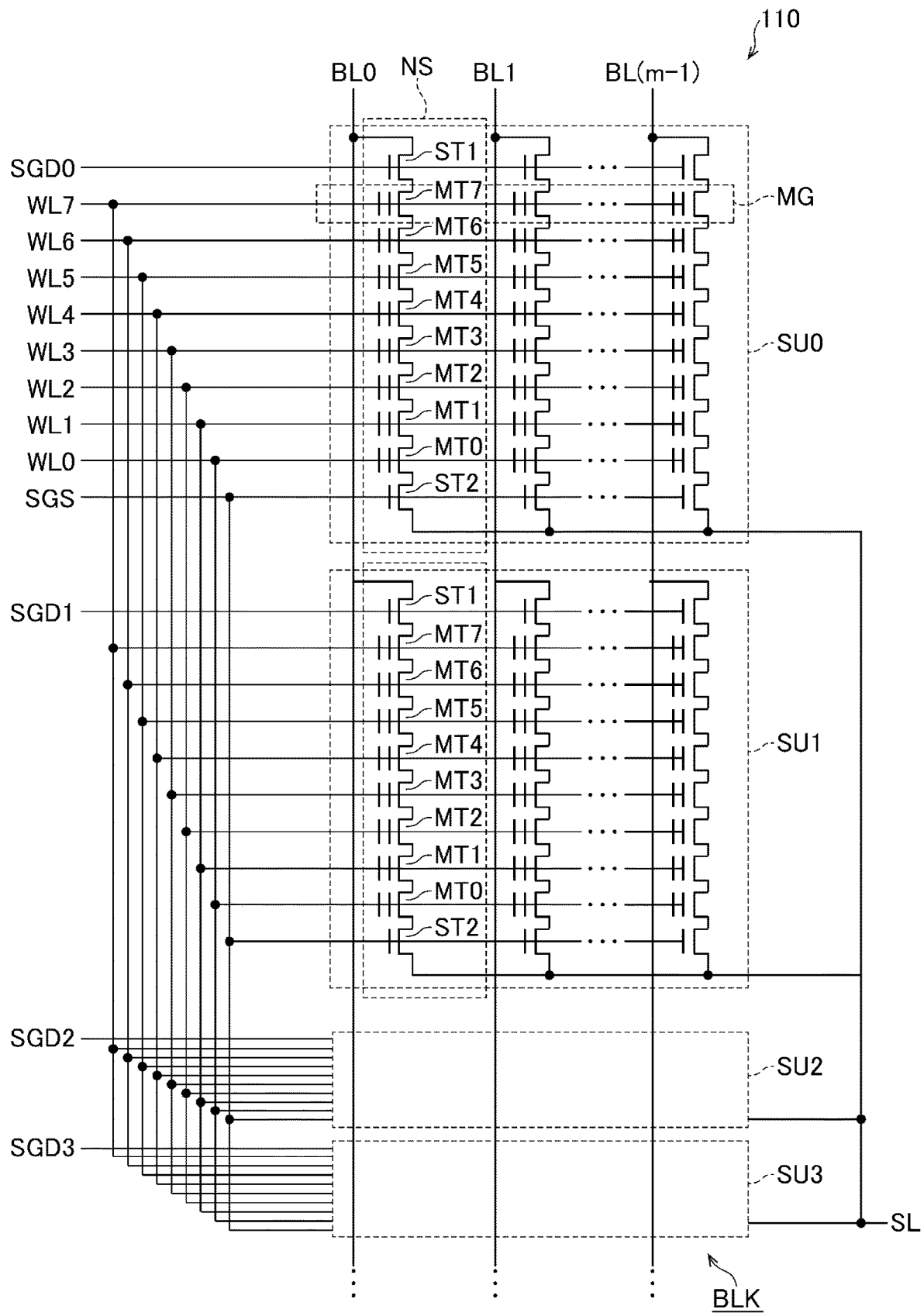
FIG. 3 is an equivalent circuit diagram illustrating the configuration of a memory cell array.

FIG. 3 illustrates the configuration of the memory cell array 110 provided in the plane PL1 as an equivalent circuit diagram. The memory cell array 110 includes a plurality of blocks BLK, but only one of these blocks BLK is illustrated in FIG. 3. The configuration of the other block BLK provided in the memory cell array 110 is also the same as that illustrated in FIG. 3.

As illustrated in FIG. 3, the block BLK includes, for example, four string units SU (SU0 to SU3). Further, each string unit SU includes a plurality of NAND strings NS. Each of the NAND strings NS includes, for example, eight memory cell transistors MT (MT0 to MT7) and select transistors ST1 and ST2.

The number of memory cell transistors MT is not limited to eight (8), and may be, for example, 32, 48, 64, or 96. For example, in order to improve the cutoff characteristic, each of the select transistors ST1 and ST2 may be configured with a plurality of transistors instead of a single transistor. Further, a dummy cell transistor may be provided between the memory cell transistor MT and the select transistors ST1 and ST2.

The memory cell transistor MT is connected in series between the select transistor ST1 and the select transistor ST2. The memory cell transistor MT7 on one end of the NAND string is connected to a source of the select transistor ST1, and the memory cell transistor MT0 on the other end of the NAND string is connected to a drain of the select transistor ST2.

The gate of the select transistor ST1 of each of the string units SU0 to SU3 is commonly connected to the select gate lines SGD0 to SGD3. The gate of the select transistor ST2 is commonly connected to the same select gate line SGS across a plurality of string units SU in the same block BLK. The gates of the memory cell transistors MT0 to MT7 in the same block BLK are commonly connected to the word lines WL0 to WL7, respectively. That is, while the word lines WL0 to WL7 and the select gate line SGS are common among a plurality of string units SU0 to SU3 in the same block BLK, the select gate line SGD is individually provided for each of the string units SU0 to SU3 even in the same block BLK.

The memory cell array 110 is provided with m bit lines BL (BL0, BL1, ..., BL(m−1)). The above "m" is an integer representing the number of NAND strings NS in one string unit SU. In each of the NAND strings NS, the drain of the select transistor ST1 is connected to the corresponding bit line BL. The source of the select transistor ST2 is connected to the source line SL. The source line SL is commonly connected to the sources of the plurality of select transistors ST2 provided in the block BLK.

The data stored in the plurality of memory cell transistors MT in the same block BLK is collectively erased. Meanwhile, reading and writing of data are collectively performed for a plurality of memory cell transistors MT connected to one word line WL and belonging to one string unit SU. Each memory cell may store 3 bits of data including a high-order bit, a middle-order bit, and a low-order bit.

That is, the semiconductor memory device 2 according to the present embodiment employs a TLC method of storing 3-bit data in one memory cell transistor MT as a method of writing data to the memory cell transistor MT. Instead of such an embodiment, an MLC method of storing 2-bit data in one memory cell transistor MT may be employed as a method of writing data to the memory cell transistor MT. The number of bits of data stored in one memory cell transistor MT, however, is not limited to 2 or 3.

In the following description, a set of 1-bit data stored by a plurality of memory cell transistors MT which are connected to one word line WL and belong to one string unit SU is referred to as a "page". In FIG. 3, a reference numeral "MG" is attached to one set of a plurality of memory cell transistors MT as described above.

When 3-bit data is stored in one memory cell transistor MT as in the present embodiment, one set of a plurality of memory cell transistors MT connected to a common word line WL in one string unit SU stores data for three pages. Among such data, the page including a set of low-order bits is also referred to as a "lower page" below, and the data of the lower page is also referred to as "lower page data" below. Similarly, the page including a set of middle-order bits is also referred to as a "middle page" below, and the data of the middle page is also referred to as "middle page data" below. The page including a set of high-order bits is also referred to as an "upper page" below, and the data of the upper page is also referred to as "upper page data" below.

Figure 4:
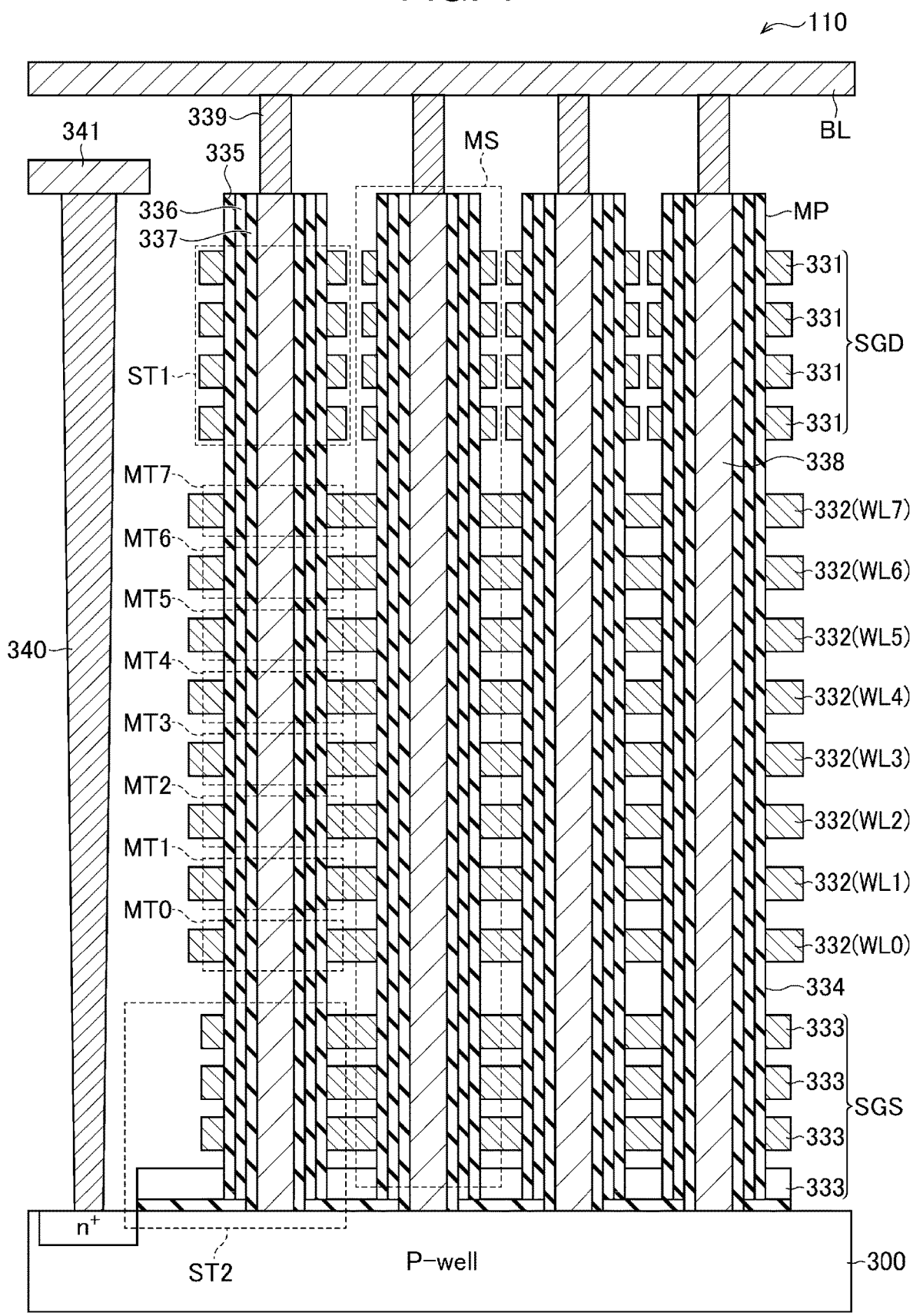
FIG. 4 is a cross-sectional view illustrating the configuration of the memory cell array.

FIG. 4 illustrates the configuration of the memory cell array 110 as a schematic cross-sectional view. As illustrated in the figure, in the memory cell array 110, a plurality of NAND strings NS is formed on the p-type well region (P-well) of a semiconductor substrate 300.

A plurality of wiring layers 333 functioning as a select gate line SGS, a plurality of wiring layers 332 functioning as a word line WL, and a plurality of wiring layers 331 functioning as a select gate line SGD are stacked above the p-type well region. An insulating layer (not illustrated) is disposed between each of the stacked wiring layers 333, 332, and 331.

A plurality of memory holes 334 is formed in the memory cell array 110. The memory hole 334 is formed to vertically penetrate the wiring layers 333, 332, and 331 and an insulating layer (not illustrated) among the wiring layers and reach the p-type well region. A block insulating film 335, a charge storage layer 336, and a gate insulating film 337 are sequentially formed on the side surface of the memory hole 334, and a semiconductor column 338 is further embedded therein. The semiconductor column 338 is made of, for example, polysilicon, and functions as a region where channels are formed during the operation of the memory cell transistors MT provided in the NAND string NS and the select transistors ST1 and ST2. As described above, a columnar body including a block insulating film 335, a charge storage layer 336, a gate insulating film 337, and a semiconductor column 338 is formed in the memory hole 334. This columnar body is also referred to as a "memory pillar MP" below.

Of the memory pillars MPs formed in the memory hole 334, each portion intersecting with each of the stacked wiring layers 333, 332, and 331 functions as a transistor. Among the plurality of transistors, the one intersecting with the wiring layer 331 functions as the select transistor ST1. Among the plurality of transistors, the one intersecting with the wiring layer 332 functions as a memory cell transistor MT (MT0 to MT7). Among the plurality of transistors, the one intersecting with the wiring layer 333 functions as the select transistor ST2. With such a configuration, each of the memory pillar MPs formed in each memory hole 334 functions as the NAND string NS described with reference to FIG. 3.

A wiring layer that functions as a bit line BL is formed above the semiconductor column 338. A contact plug 339 for connecting the semiconductor column 338 and the bit line BL is formed at the upper part of the semiconductor column 338.

Further, an n+ type impurity diffusion layer and a p+ type impurity diffusion layer (not illustrated) are formed on the surface of the p-type well region. A contact plug 340 is formed on the n+ type impurity diffusion layer, and a wiring layer 341 is formed on the contact plug 340. The wiring layer 341 is a wiring for adjusting the voltage of the source line SL, and connected to the NAND string NS through an inversion layer formed in the p-type well region directly under the select gate line SGS at the time of reading. The p+ type impurity diffusion layer (not illustrated) is a wiring for adjusting the voltage of the p-type well region.

A plurality of configurations similar to the configuration illustrated in FIG. 4 is disposed along the depth direction of the paper surface of FIG. 4. One string unit SU is formed by a set of a plurality of NAND strings NS arranged in a line along the depth direction of the paper surface of FIG. 4.

Further, in the present embodiment, as described above, the p-type well region of the semiconductor substrate 300 is used as the source line SL. Instead of such an embodiment, a conductor layer formed at a position above the semiconductor substrate 300 may be used as the source line SL. In this case, a peripheral circuit such as a sense amplifier 120 may be disposed in a portion between the semiconductor substrate 300 and the conductor layer.

The explanation will be continued by referring back to FIG. 2. As described above, the plane PL1 is provided with a sense amplifier 120 and a row decoder 130 in addition to the memory cell array 110 described above.

The sense amplifier 120 is a circuit that adjusts the voltage applied to the bit line BL or reads the voltage of the bit line BL to convert it into data. When reading data, the sense amplifier 120 acquires the read data read from the memory cell transistor MT to the bit line BL, and transfers the acquired read data to the input/output circuit 21. When writing data, the sense amplifier 120 transfers the write data written via the bit line BL to the memory cell transistor MT.

The row decoder 130 is a circuit configured as a group of switches (not illustrated) that applies a voltage to each of the word line WL. The row decoder 130 receives a block address and a row address from the register 42, selects the corresponding block BLK based on the block address, and selects the corresponding word line WL based on the row address. The row decoder 130 switches the opening and closing of switches in the above-described switch group so that the voltage from the voltage generation circuit 43 is applied to the selected word line WL.

Figure 5:
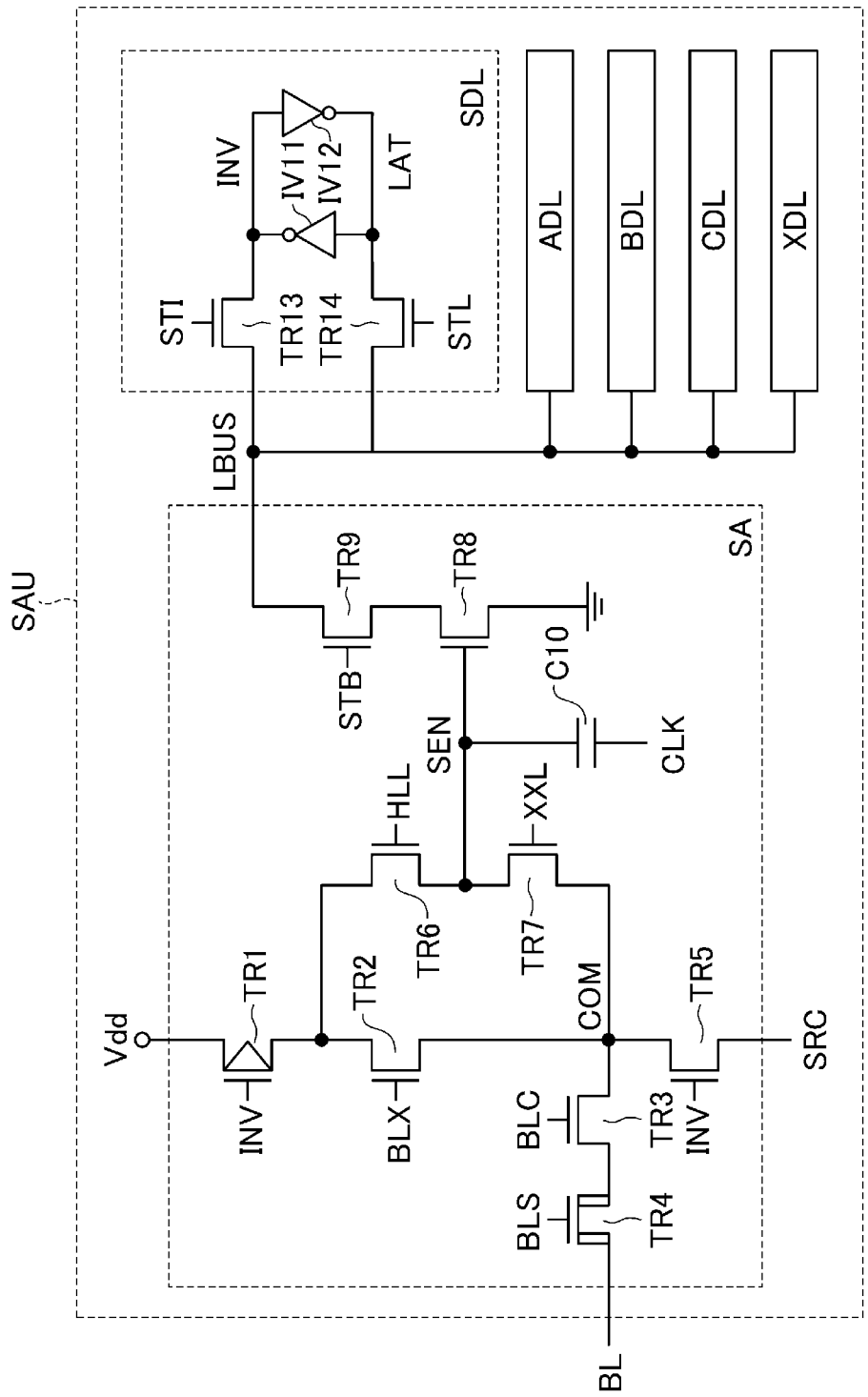
FIG. 5 is a diagram illustrating a circuit configuration of a sense amplifier unit.

FIG. 5 illustrates a configuration example of the sense amplifier 120. The sense amplifier 120 includes a plurality of sense amplifier units SAU associated with each of the plurality of bit lines BL. FIG. 5 illustrates the detailed circuit configuration of one of these sense amplifier units SAU.

As illustrated in FIG. 5, the sense amplifier unit SAU includes a sense amplifier unit SA and latch circuits SDL, ADL, BDL, CDL, and XDL. The sense amplifier unit SA, and the latch circuits SDL, ADL, BDL, CDL, and XDL are connected by a bus LBUS so that data may be transmitted and received between each other.

For example, in the read operation, the sense amplifier unit SA senses the data read to the corresponding bit line BL, and determines whether the read data is "0" or "1". The sense amplifier unit SA includes, for example, a transistor TR1 which is a p-channel MOS transistor, transistors TR2 to TR9 which are n-channel MOS transistors, and a capacitor C10.

One end of the transistor TR1 is connected to the power supply line, and the other end of the transistor TR1 is connected to the transistor TR2. The gate of the transistor TR1 is connected to a node INV in the latch circuit SDL. One end of the transistor TR2 is connected to the transistor TR1, and the other end of the transistor TR2 is connected to a node COM. A signal BLX is input to the gate of the transistor TR2. One end of the transistor TR3 is connected to the node COM, and the other end of the transistor TR3 is connected to the transistor TR4. A signal BLC is input to the gate of the transistor TR3. The transistor TR4 is a high breakdown voltage MOS transistor. One end of the transistor TR4 is connected to the transistor TR3. The other end of the transistor TR4 is connected to the corresponding bit line BL. A signal BLS is input to the gate of the transistor TR4.

One end of the transistor TR5 is connected to the node COM, and the other end of the transistor TR5 is connected to a node SRC. The gate of the transistor TR5 is connected to the node INV. One end of the transistor TR6 is connected between the transistor TR1 and the transistor TR2, and the other end of the transistor TR6 is connected to a node SEN. A signal HLL is input to the gate of the transistor TR6. One end of the transistor TR7 is connected to the node SEN, and the other end of the transistor TR7 is connected to the node COM. A signal XXL is input to the gate of the transistor TR7.

One end of the transistor TR8 is grounded, and the other end of the transistor TR8 is connected to the transistor TR9. The gate of the transistor TR8 is connected to the node SEN. One end of the transistor TR9 is connected to the transistor TR8, and the other end of the transistor TR9 is connected to the bus LBUS. A signal STB is input to the gate of the transistor TR9. One end of the capacitor C10 is connected to the node SEN. A clock CLK is input to the other end of the capacitor C10.

The signals BLX, BLC, BLS, HLL, XXL, and STB are generated by, for example, the sequencer 41. Further, for example, a voltage Vdd, which is an internal power supply voltage of the semiconductor memory device 2, is applied to the power supply line connected to one end of the transistor TR1, and, for example, a voltage Vss, which is the ground voltage of the semiconductor memory device 2, is applied to the node SRC.

The latch circuits SDL, ADL, BDL, CDL, and XDL temporarily store the read data. The latch circuit XDL is connected to the input/output circuit 21 and is used for data input/output between the sense amplifier unit SAU and the input/output circuit 21. The read data is stored in the latch circuit XDL so that it may be output from the input/output circuit 21 to the memory controller 1. For example, the data read by the sense amplifier unit SAU is stored in any of the latch circuits ADL, BDL, and CDL, then transferred to the latch circuit XDL, and output from the latch circuit XDL to the input/output circuit 21. Further, for example, the data input from the memory controller 1 to the input/output circuit 21 is transferred from the input/output circuit 21 to the latch circuit XDL, and is transferred from the latch circuit XDL to any of the latch circuits ADL, BDL, and CDL.

The latch circuit SDL includes, for example, inverters IV11 and IV12 and transistors TR13 and TR14, which are re-channel MOS transistors. The input node of the inverter IV11 is connected to a node LAT. The output node of the inverter IV11 is connected to the node INV. The input node of the inverter IV12 is connected to the node INV. The output node of the inverter IV12 is connected to the node LAT. One end of the transistor TR13 is connected to the node INV, and the other end of the transistor TR13 is connected to the bus LBUS. A signal STI is input to the gate of the transistor TR13. One end of the transistor TR14 is connected to the node LAT, and the other end of the transistor TR14 is connected to the bus LBUS. A signal STL is input to the gate of the transistor TR14. For example, the data stored in the node LAT corresponds to the data stored in the latch circuit SDL. Further, the data stored in the node INV corresponds to the inverted data of the data stored in the node LAT. Since the circuit configuration of the latch circuit ADL, BDL, CDL, and XDL is the same as the circuit configuration of the latch circuit SDL, the description thereof will be omitted.

Figure 6:
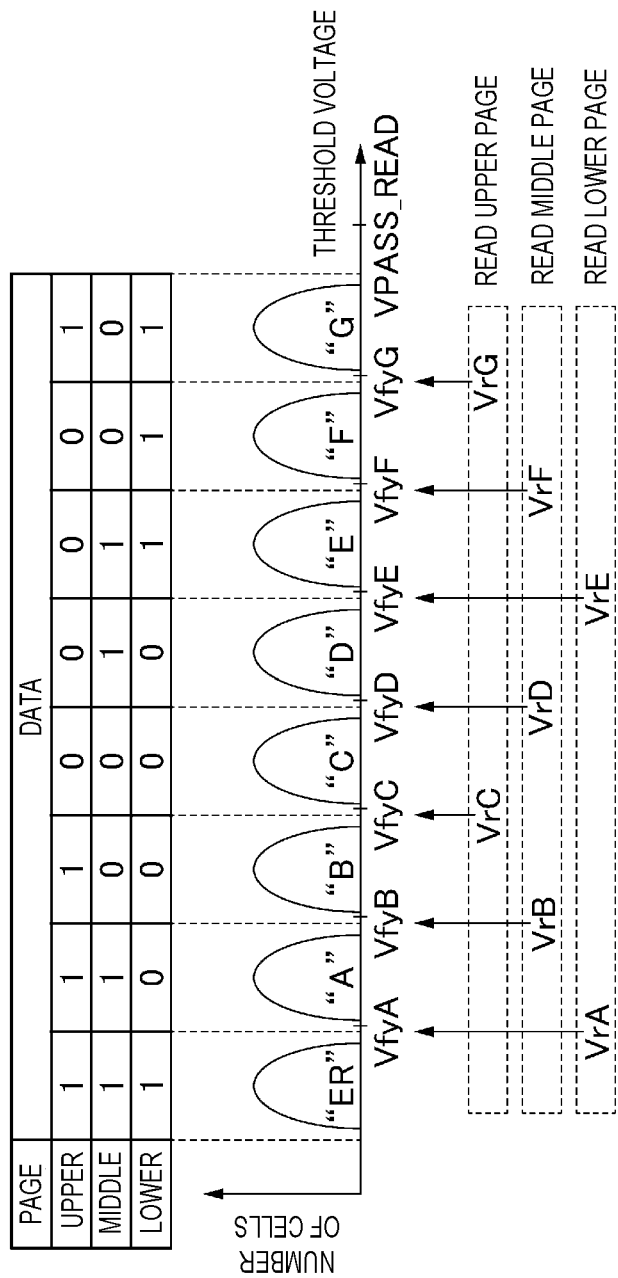
FIG. 6 is a diagram illustrating an example of a threshold voltage distribution of a memory cell transistor.

FIG. 6 is a diagram schematically illustrating a threshold voltage distribution of the memory cell transistor MT. The figure in the middle of FIG. 6 illustrates a correspondence between the threshold voltage (horizontal axis) of the memory cell transistor MT and the number of memory cell transistors MT (vertical axis).

When the TLC method is employed as in the present embodiment, the plurality of memory cell transistors MT form eight (8) threshold voltage distributions as illustrated in the middle section of FIG. 6. The eight (8) threshold voltage distributions correspond to write states and are referred to as an "ER" state, "A" state, "B" state, "C" state, "D" state, "E" state, "F" state, and "G" state, respectively, in order from the lowest threshold voltage.

The table at the top of FIG. 6 illustrates an example of data assigned corresponding to each of the above-described states of threshold voltage. As illustrated in the table, for example, different 3-bit data is assigned to the "ER" state, "A" state, "B" state, "C" state, "D" state, "E" state, "F" state, and "G" state, respectively, as represented below.

"ER" state: "111" ("lower bit/middle bit/higher bit")
"A" state: "011"
"B" state: "001"
"C" state: "000"
"D" state: "010"
"E" state: "110"
"F" state: "100"
"G" state: "101"

The verify voltage used in the write operation is set between a pair of threshold voltage distributions adjacent to each other. Specifically, verify voltages VfyA, VfyB, VfyC, VfyD, VfyE, VfyF, and VfyG are set corresponding to the "A" state, "B" state, "C" state, "D" state, "E" state, "F" state, and "G" state, respectively.

The verify voltage VfyA is set between the maximum threshold voltage of the "ER" state and the minimum threshold voltage of the "A" state. When the verify voltage VfyA is applied to the word line WL, among the memory cell transistors MT connected to the word line WL, the memory cell transistor MT whose threshold voltage is included in the "ER" state is turned ON, and the memory cell transistor MT whose threshold voltage is included in the threshold voltage distribution equal to or higher than the "A" state is turned OFF.

Other verify voltages VfyB, VfyC, VfyD, VfyE, VfyF, and VfyG are also set in the same manner as the above-described verify voltage VfyA. The verify voltage VfyB is set between the "A" state and the "B" state, the verify voltage VfyC is set between the "B" state and the "C" state, the verify voltage VfyD is set between the "C" state and the "D" state, the verify voltage VfyE is set between the "D" state and the "E" state, and the verify voltage VfyF is set between the "E" state and the "F" state, and the verify voltage VfyG is set between the "F" state and the "G" state.

For example, the verify voltage VfyA may be set to 0.8 V, the verify voltage VfyB may be set to 1.6 V, the verify voltage VfyC may be set to 2.4 V, the verify voltage VfyD may be set to 3.1 V, the verify voltage VfyE may be set to 3.8 V, the verify voltage VfyF may be set to 4.6 V, and the verify voltage VfyG may be set to 5.6 V. However, without being limited to this, the verify voltages VfyA, VfyB, VfyC, VfyD, VfyE, VfyF, and VfyG may be appropriately and stepwise set in the range of, for example, 0 V to 7.0 V.

Further, a read voltage used in the read operation is set between adjacent threshold voltage distributions. The "read voltage" is a voltage applied to the word line WL connected to the memory cell transistor MT to be read, that is, the selected word line during the read operation. In the read operation, data is determined based on a determination result of whether the threshold voltage of the memory cell transistor MT to be read is higher than the applied read voltage.

As schematically illustrated in the lower part of FIG. 6, specifically, the read voltage VrA, which determines whether the threshold voltage of the memory cell transistor MT is included in the "ER" state or equal to or higher than the "A" state, is set between the maximum threshold voltage of the "ER" state and the minimum threshold voltage of the "A" state.

Other read voltages VrB, VrC, VrD, VrE, VrF, and VrG are also set in the same manner as the above-described read voltage VrA. The read voltage VrB is set between the "A" state and the "B" state, the read voltage VrC is set between the "B" state and the "C" state, the read voltage VrD is set between the "C" state and the "D" state, the read voltage VrE is set between the "D" state and the "E" state, the read voltage VrF is set between the "E" state and the "F" state, and the read voltage VrG is set between the "F" state and the "G" state.

The read pass voltage VPASS_READ is set to a voltage higher than the maximum threshold voltage of the highest threshold voltage distribution (e.g., "G" state). The memory cell transistor MT in which the read pass voltage VPASS_READ is applied to the gate is turned ON regardless of the data to be stored.

Further, the verify voltages VfyA, VfyB, VfyC, VfyD, VfyE, VfyF, and VfyG are set to higher voltages than, for example, the read voltages VrA, VrB, VrC, VrD, VrE, VrF, and VrG, respectively. That is, the verify voltages VfyA, VfyB, VfyC, VfyD, VfyE, VfyF, and VfyG are set near the lower end of the threshold voltage distribution of the "A" state, "B" state, "C" state, "D" state, "E" state, "F" state, and "G" state, respectively.

When the data assignment as described above is applied, the one-page data of the low-order bits (lower page data) in the read operation may be determined by the reading result using the read voltages VrA and VrE. The one-page data of the middle-order bits (middle page data) may be determined by the reading result using the read voltages VrB, VrD, and VrF. The one-page data of the high-order bit (upper page data) may be determined by the reading result using the read voltages VrC and VrG. In this way, since the lower page data, the middle page data, and the upper page data are determined by the read operations twice, three times, and twice, respectively, the above data assignment is referred to as a "2-3-2 code".

The data assignment as described above is only an example, and the actual data assignment is not limited thereto. For example, 2 bits or 4 bits or more of data may be stored in one memory cell transistor MT. Further, the number of threshold voltage distributions to which data is assigned may be 7 or less, or 9 or more. For example, a "1-3-3 code" or a "1-2-4 code" may be used instead of the "2-3-2 code". Further, for example, the assignment of the lower bit/middle bit/higher bit may be changed. More specifically, for example, in the "2-3-2 code", data may be assigned so that the lower page data is determined by the reading result using the read voltages VrC and VrG, the middle page data is determined by the reading result using the read voltages VrB, VrD, and VrF, and the upper page data is determined by the reading result using the read voltages VrA and VrE. That is, for example, the assignment of the lower order bit and the higher order bit may be exchanged with each other. In this case, data is assigned as follows corresponding to each state of the threshold voltage.

"ER" state: "111" ("lower bit/middle bit/higher bit")
"A" state: "110"
"B" state: "100"
"C" state: "000"
"D" state: "010"
"E" state: "011"
"F" state: "001"
"G" state: "101"

The write operation performed in the semiconductor memory device 2 will be described. In the write operation, a program operation and a verify operation are performed. The "program operation" is an operation of increasing the threshold voltage of the memory cell transistor MT by injecting electrons into the charge storage layer 336 of the memory cell transistor MT. The program operation also includes maintaining the threshold voltage of the memory cell transistor MT by inhibiting the injection of electrons into the charge storage layer 336 of the memory cell transistor MT.

The "verify operation" is an operation of determining whether the threshold voltage of the memory cell transistor MT has reached the target state by reading data after the above-described program operation in the write operation. The memory cell transistor MT whose threshold voltage has reached the target state is subsequently write-inhibited. The memory cell transistor MT whose threshold voltage has not reached the target state is subsequently written again.

In the write operation, a combination of the program operation and the verify operation described above is repeated. As a result, the threshold voltage of the memory cell transistor MT rises to the target state.

Figure 7:
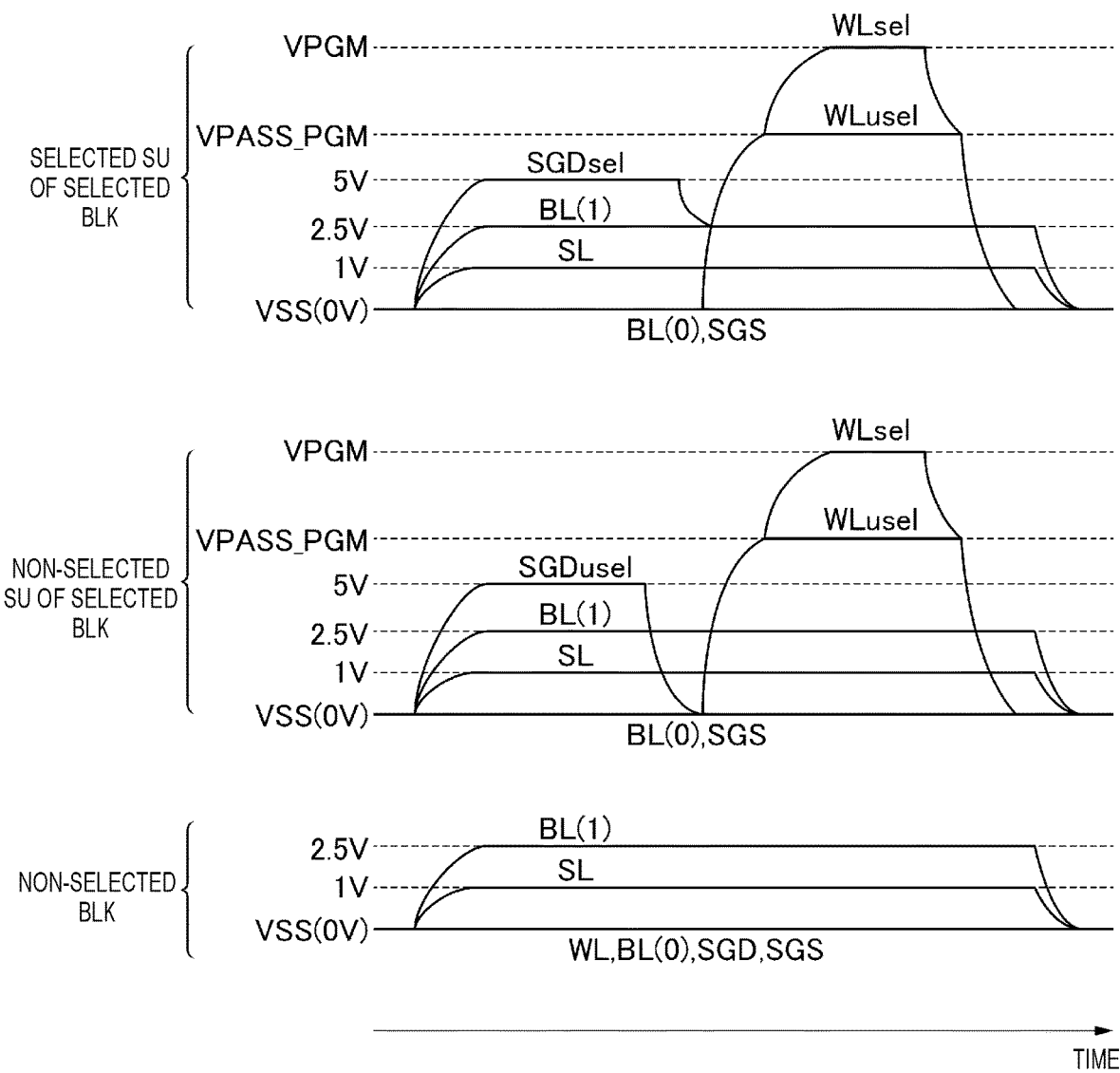
FIG. 7 is a diagram illustrating a voltage change of each wiring during a write operation.

FIG. 7 illustrates the voltage change of each wiring during the program operation. Hereinafter, an example in which the program operation is performed in the plane PL1 will be described, but the program operation in the plane PL2 is also performed in the same manner as in the case of the plane PL1 to be described below.

In the program operation, the sense amplifier 120 changes the voltage of each bit line BL corresponding to the program data. A ground voltage Vss (e.g., 0 V) is applied as the "L" state to the bit line BL connected to the memory cell transistor MT to be programmed (which needs its threshold voltage increased). For example, 2.5 V is applied as the "H" state to the bit line BL connected to the memory cell transistor MT that is not to be programmed (which needs to maintain its threshold voltage). The former bit line BL is described as "BL (0)" in FIG. 7. The latter bit line BL is described as "BL (1)" in FIG. 7.

The row decoder 130 selects any block BLK as the target of the write operation, and further selects any string unit SU. More specifically, for example, 5 V is applied from the voltage generation circuit 43 to the select gate line SGD (selected select gate line SGDsel) in the selected string unit SU via the row decoder 130. As a result, the select transistor ST1 is turned ON. Meanwhile, for example, a voltage Vss is applied to the select gate line SGS from the voltage generation circuit 43 via the row decoder 130. As a result, the select transistor ST2 is turned OFF.

Further, for example, a voltage of 5 V is applied from the voltage generation circuit 43 to the select gate line SGD (non-selected select gate line SGDusel) of the non-selected string unit SU in the selected block BLK via the row decoder 130. As a result, the select transistor ST1 is turned ON. In the string unit SU of each block BLK, the select gate line SGS is commonly connected. Therefore, even in the non-selected string unit SU, the select transistor ST2 is turned OFF.

Further, for example, a voltage Vss is applied from the voltage generation circuit 43 to the select gate line SGD and the select gate line SGS in the non-selected block BLK via the row decoder 130. As a result, the select transistor ST1 and the select transistor ST2 are turned OFF.

The source line SL has a voltage higher than the voltage of the select gate line SGS. The voltage is, for example, 1 V.

After that, the voltage of the selected select gate line SGDsel in the selected block BLK is set to, for example, 2.5 V. This voltage turns ON the select transistor ST1 corresponding to the bit line BL (0) to which 0 V is given in the above-described example, but cuts OFF the select transistor ST1 corresponding to the bit line BL (1) to which 2.5 V is given. As a result, in the selected string unit SU, the select transistor ST1 corresponding to the bit line BL (0) is turned ON, and the select transistor ST1 corresponding to the bit line BL (1) to which 2.5 V is given is cut OFF. Meanwhile, the voltage of the non-selected select gate line SGDusel is set to, for example, a voltage Vss. As a result, in the non-selected string unit SU, the select transistor ST1 is cut OFF regardless of the voltages of the bit line BL (0) and the bit line BL (1).

Then, the row decoder 130 selects any word line WL as the target of the write operation in the selected block BLK. For example, a voltage VPGM is applied from the voltage generation circuit 43 to the word line WL (selected word line WLsel), which is the target of the write operation, via the row decoder 130. Meanwhile, for example, the voltage VPASS_PGM is applied from the voltage generation circuit 43 to the other word line WL (non-selected word line WLusel) via the row decoder 130. The voltage VPGM is a high voltage for injecting electrons into the charge storage layer 336 by the tunnel phenomenon. The voltage VPASS_PGM does not change the threshold voltage while turning ON the memory cell transistor MT connected to the word line WL. The voltage VPGM is higher than the voltage VPASS_PGM.

In the NAND string NS corresponding to the bit line BL (0) to be programmed, the select transistor ST1 is turned ON. Therefore, the channel voltage of the memory cell transistor MT connected to the selected word line WLsel becomes 0 V. The voltage difference between a control gate and a channel becomes larger, and as a result, electrons are injected into the charge storage layer 336, so that the threshold voltage of the memory cell transistor MT is increased.

In the NAND string NS corresponding to the bit line BL (1) which is not to be programmed, the select transistor ST1 is in the cutoff state. Therefore, the channel of the memory cell transistor MT connected to the selected word line WLsel becomes electrically floating, and the channel voltage is raised to be near the voltage VPGM by capacitive coupling with the word line WL. The voltage difference between the control gate and the channel becomes smaller, and as a result, the electrons are not injected into the charge storage layer 336, so that the threshold voltage of the memory cell transistor MT is maintained. To be precise, the threshold voltage does not fluctuate to the extent that the threshold voltage distribution state transitions to a higher distribution.

In the write operation, the program operation and the verify operation are repeated until it is confirmed that the data has been written correctly. FIG. 8 illustrates an example in which data is written by repeating a combination of the program operation and the verify operation nineteen (19) times. Each operation repeated in this way is also referred to as a "loop" below.

FIG. 8 illustrates the target state of the verify operation performed in each loop. As illustrated in the figure, in the first and second loops, the verify operation is performed only for the "A" state. That is, during the verify operation in the first and second loops, the voltage VfyA is applied to the selected word line WLsel, and the voltages VfyB to VfyG are not applied. In the following third and fourth loops, the verify operation is performed for the "A" state and the "B" state. That is, during the verify operation in the third and fourth loops, the verify voltages VfyA and VfyB are sequentially applied to the selected word line WLsel, and the verify voltages VfyC to VfyG are not applied.

In the fifth and sixth loops, the verify operation is performed for the "A" state, the "B" state, and the "C" state. That is, during the verify operation in the fifth and sixth loops, the verify voltages VfyA, VfyB, and VfyC are sequentially applied to the selected word line WLsel, and the verify voltages VfyD to VfyG are not applied. Then, the verify operation targeting the "A" state is completed in the sixth loop. This is because it has been empirically determined that the program to the "A" state is almost completed in, for example, six (6) loops.

Further, in the seventh and eighth loops, the verify operation is performed for the "B" state, the "C" state, and the "D" state. That is, during the verify operation in the seventh and eighth loops, the verify voltages VfyB, VfyC, and VfyD are sequentially applied to the selected word line WLsel. Then, the verify operation targeting the "B" state is completed by the eighth write operation. Further, in the ninth and tenth loops, the verify operation is performed for the "C" state, the "D" state, and the "E" state. That is, during the verify operation in the ninth and tenth loops, the verify voltages VfyC, VfyD, and VfyE are sequentially applied to the selected word line WLsel. Then, the verify operation targeting the "C" state is completed in the tenth loop.

After that, the writing until the "G" state is performed in the same manner, and the loop is repeated up to nineteen (19) times.

Figure 9:
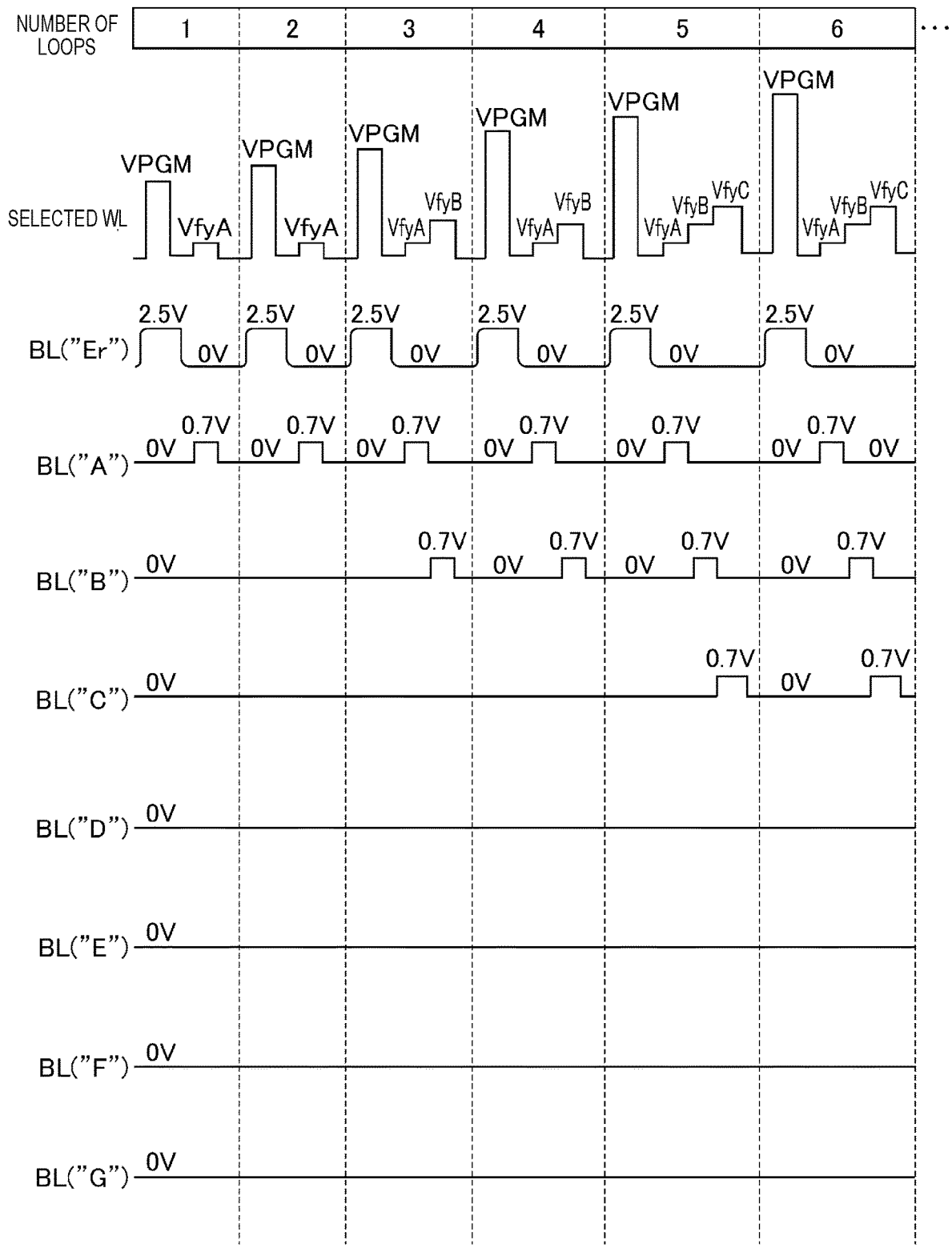
FIG. 9 is a diagram illustrating a voltage change of each wiring during a write operation.

FIG. 9 illustrates a state of the voltage of each wiring during the write operation as described above. FIG. 9 illustrates the change in the voltage with respect to time, of the selected word line WLsel in the first to sixth loops, of the bit line BL (denoted as BL ("Er") in FIG. 9) corresponding to the memory cell transistor MT that needs to maintain the "Er" state, and of the bit line BL corresponding to the memory cell transistor MT whose threshold needs to be raised to a value within the "A" to "G" states (denoted as BL ("A"), BL ("B"), BL ("C"), BL ("D"), BL ("E"), BL ("F"), and BL ("G"), respectively, in FIG. 9).

As illustrated in the figure, in the first loop, a program operation is performed for the memory cell transistor MT connected to each of the bit lines BL ("A") to BL ("G"). Specifically, a voltage VPGM is applied to the selected word line WLsel, for example, 2.5 V is applied to the bit line BL ("Er"), and, for example, a voltage VSS (=0 V) is applied to the bit lines BL ("A") to BL ("G"). As a result, the threshold voltage of the selected memory cell transistor MT connected to each of the bit lines BL ("A") to BL ("G") rises.

Following such a program operation, a verify operation for the "A" state is performed. Specifically, the bit line BL ("A") is pre-charged to, for example, 0.7 V, and the verify voltage VfyA is applied to the selected word line WLsel. The other bit lines BL ("Er") and BL ("B") to BL ("G") are fixed to, for example, 0 V and are excluded from the verify target. As a result, as described above with reference to FIG. 8, the verify operation is performed only for the "A" state in the first loop.

In the second loop, a program operation is performed for the memory cell transistor MT connected to each of the bit line BL ("A") and the bit lines BL ("B") to BL ("G") that fail the verify operation for the first "A" state. At this time, the voltage VPGM applied to the selected word line WLsel is stepped up to be slightly larger than the voltage VPGM in the first loop. After that, the verify operation for the "A" state is executed as in the first time. That is, even in the second loop, the verify operation is performed only for the "A" state.

In the third loop, as in the second loop, a program operation is performed for the memory cell transistor MT connected to each of the bit line BL ("A"), which fail the verify operation for the "A" state, and the bit lines BL ("B") to BL ("G"). At this time, the voltage VPGM applied to the selected word line WLsel is further stepped up to be slightly larger than the voltage VPGM in the second loop. After that, the verify operation for the "A" state is executed as in the first and second times.

Subsequently, the verify operation for the "B" state is executed. Specifically, the bit lines BL ("A") and BL ("B") are pre-charged to, for example, 0.7 V, and the verify voltages VfyA and VfyB are sequentially applied to the selected word line WLsel. The other bit lines BL ("Er") and BL ("C") to BL ("G") are fixed to, for example, 0 V and are excluded from the verify target. As a result, as described above with reference to FIG. 8, the verify operation is performed for the "A" state and the "B" state in the third loop.

In the fourth loop, the voltage VPGM is further stepped up to perform the same operation as in the third loop.

In the fifth loop, a program operation is performed for the memory cell transistor MT connected to each of the bit lines BL ("A"), BL ("B"), and BL ("C"). Subsequently, a verify operation is performed for the "A" state, the "B" state, and the "C" state. In the sixth loop, the voltage VPGM is stepped up and the same operation as in the fifth loop is performed.

Even after the seventh loop, the program operation and verify operation as described above are repeatedly performed. As a result, the application of the voltage VPGM and the application of the verify voltage VfyA are alternately repeated on the selected word line WLsel.

Figure 10:
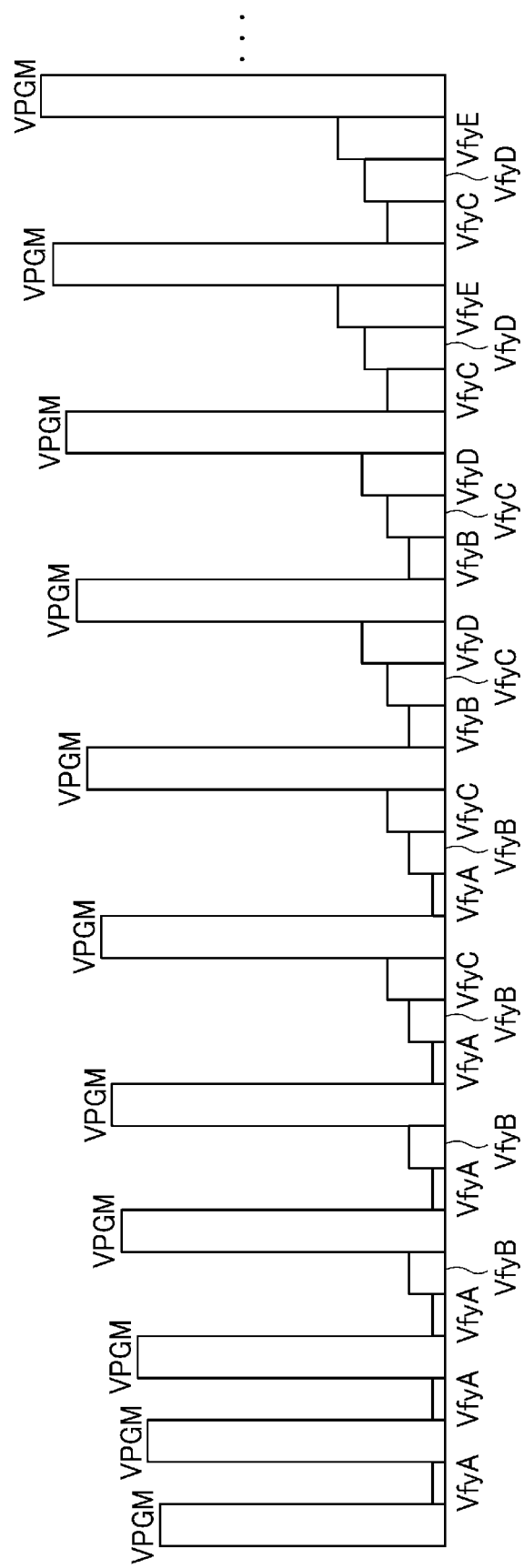
FIG. 10 is a diagram illustrating a voltage change of a word line during a write operation.

As illustrated in FIG. 9, in each loop, the application of the verify voltage VfyA following the application of the voltage VPGM is repeated once or plural times. The number of times the verify voltage VfyA is repeatedly applied in each loop is in the range of 1 to 3 times in the example of FIG. 9, but the number of times may be different from this example. The graph of FIG. 10 schematically illustrates how the voltage VPGM is repeatedly applied to the selected word line WLsel and how the verify voltage VfyA is repeatedly applied.

Figure 11:
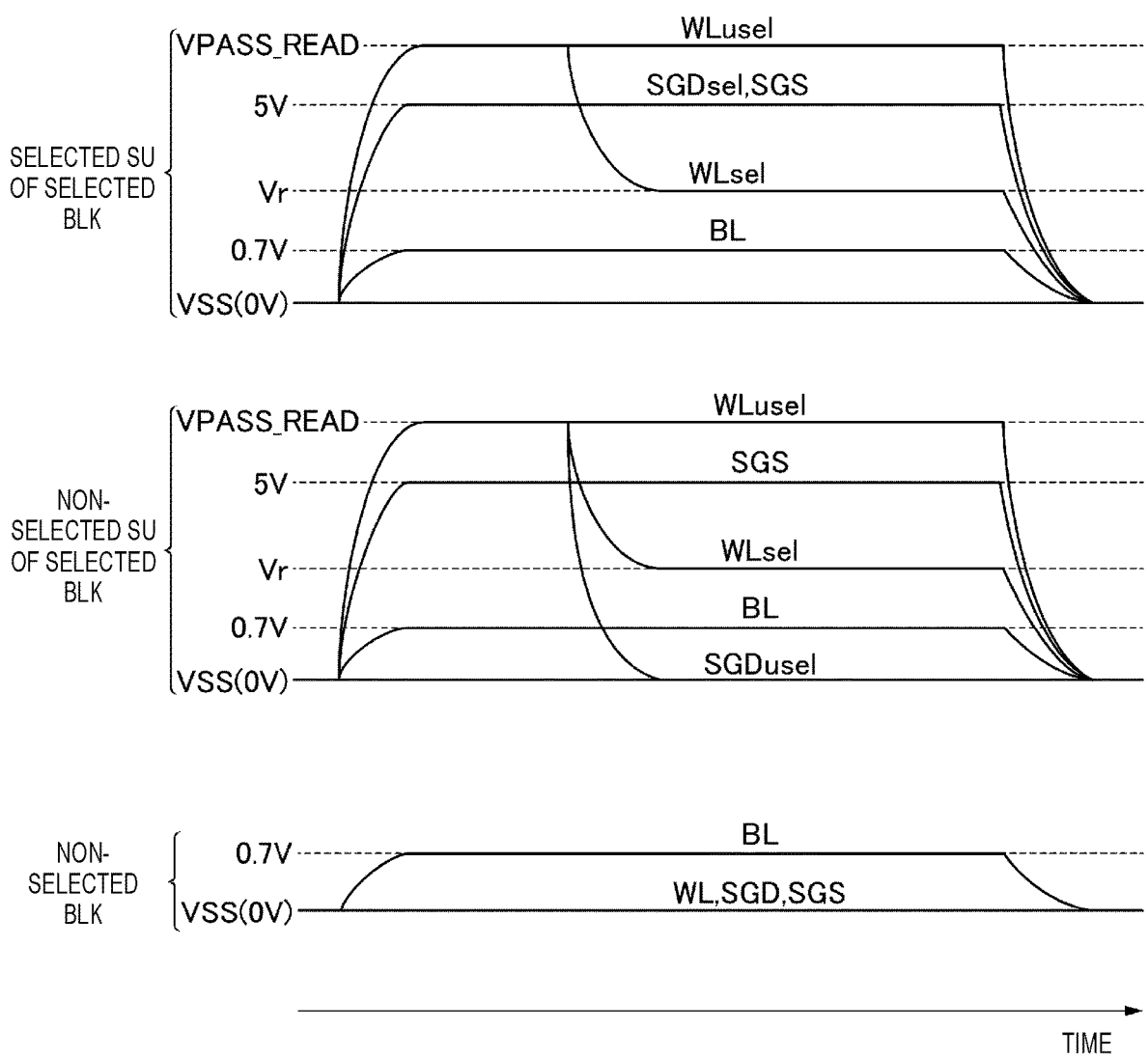
FIG. 11 is a diagram illustrating a voltage change of each wiring during a read operation.

The outline of the read operation (which is performed during the verify operation) will be described. FIG. 11 illustrates the voltage change of each wiring during the read operation. Hereinafter, an example in which the read operation is performed in the plane PL1 will be described, but the read operation in the plane PL2 is also performed in the same manner as in the case of the plane PL1 to be described below.

In the read operation, the NAND string NS including the memory cell transistor MT, which is the target of the read operation, is selected. Alternatively, the string unit SU including the page to be read is selected.

First, for example, 5 V is applied from the voltage generation circuit 43 to the selected select gate line SGDsel, the non-selected select gate line SGDusel, and the select gate line SGS via the row decoder 130. As a result, the select transistor ST1 and the select transistor ST2 in the selected block BLK are turned ON. Further, for example, a read pass voltage VPASS_READ is applied from the voltage generation circuit 43 to the selected word line WLsel and the non-selected word line via the row decoder 130. The read pass voltage VPASS_READ is a voltage that turns ON the memory cell transistor MT regardless of the threshold voltage of the memory cell transistor MT and does not change the threshold voltage. As a result, the current flows in all the NAND strings NS in the selected block BLK regardless of whether it is the selected string unit SU or the non-selected string unit SU.

Next, a read voltage Vr such as, for example, VrA is applied from the voltage generation circuit 43 via the row decoder 130 to the word line WL (selected word line WLsel) connected to the memory cell transistor MT to be read. The read pass voltage VPASS_READ is applied to the other word line WL (non-selected word line WLsel).

Further, while maintaining the voltage applied to the selected select gate line SGDsel and the select gate line SGS, for example, a voltage Vss is applied to the non-selected select gate line SGDusel from the voltage generation circuit 43 via the row decoder 130. As a result, the select transistor ST1 in the selected string unit SU is kept ON, but the select transistor ST1 in the non-selected string unit SU is turned OFF. The select transistor ST2 in the selected block BLK is turned ON regardless of whether it is in the selected string unit SU or the non-selected string unit SU.

As a result, the NAND string NS in the non-selected string unit SU does not form a current path because at least the select transistor ST1 is turned OFF. Meanwhile, in the NAND string NS in the selected string unit SU, a current path is formed or is not formed depending on a relationship between the read voltage Vr applied to the selected word line WLsel and the threshold voltage of the memory cell transistor MT.

The sense amplifier 120 applies a voltage to the bit line BL connected to the selected NAND string NS. In this state, the sense amplifier 120 reads out data based on the amount of the current flowing through the bit line BL. Specifically, it is determined whether the threshold voltage of the memory cell transistor MT, which is the target of the read operation, is higher than the read voltage applied to the memory cell transistor MT. Alternatively, instead of reading out the data based on the amount of the current flowing through the bit line BL, the data may be read out based on the change in the voltage of the bit line BL with respect to time. In the latter case, the bit line BL is pre-charged to have a predetermined voltage in advance.

The verify operation described above is also performed in the same manner as the read operation as described above. In the verify operation, a verify voltage such as, for example, VfyA is applied from the voltage generation circuit 43 to the word line WL connected to the memory cell transistor MT, which is to be verified, via the row decoder 130.

The example of FIG. 11 described above is an example in which a single voltage is applied as the read voltage Vr for easy understanding. In the actual read operation, a plurality of voltages is applied stepwise as the read voltage Vr. That is, the read voltage Vr is switched to pass through a plurality of values.

In the present embodiment, as described above, the one-page data of the lower bits (lower page data) may be determined by the reading result using the read voltages VrA and VrE. Therefore, in the read operation for the lower page data, the read voltage Vr is sequentially switched to two values, VrA and VrE.

Figure 12:
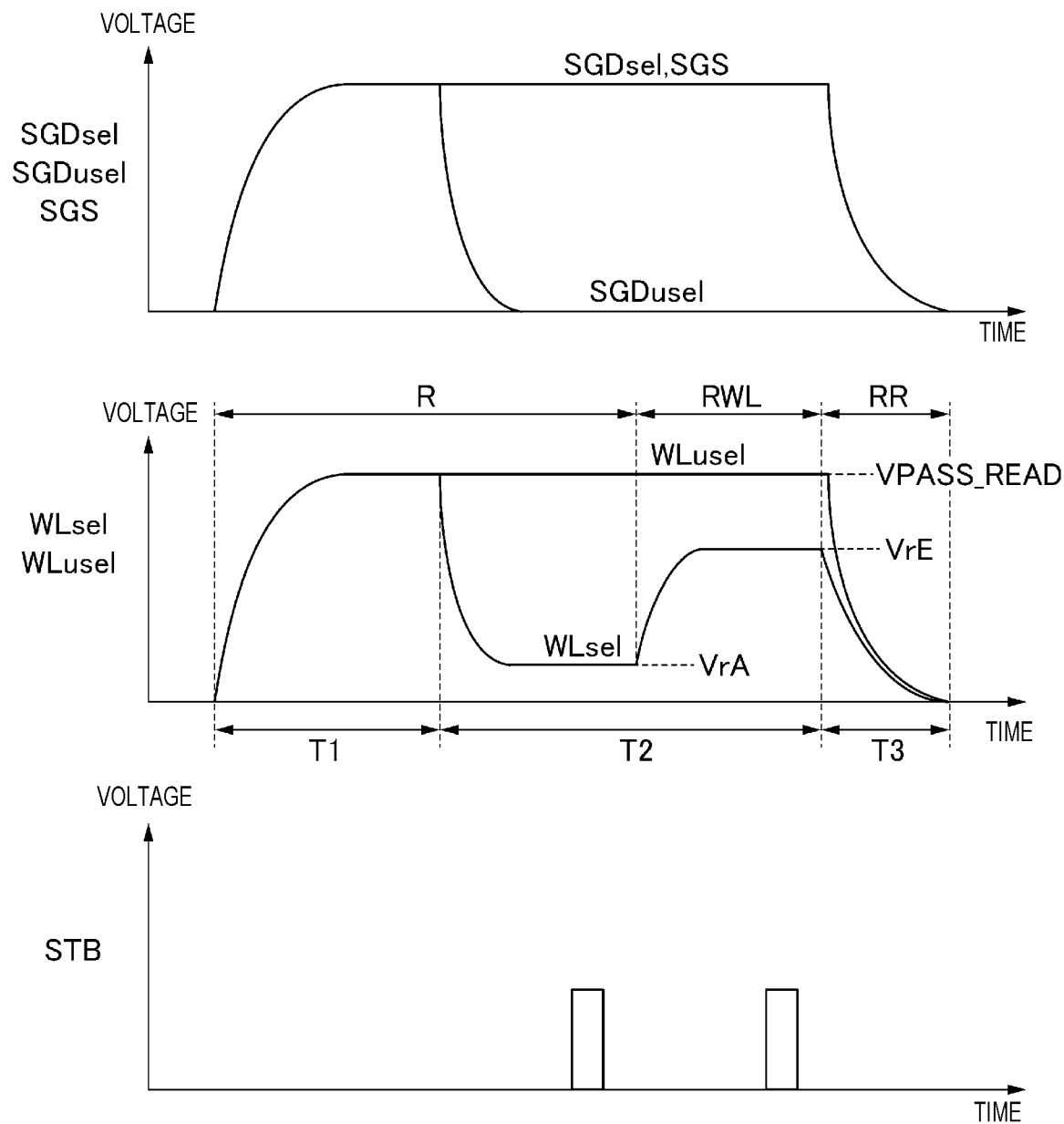
FIG. 12 is a diagram illustrating a voltage change of each wiring during a read operation of a lower page.

FIG. 12 illustrates an example of a relationship between the voltage applied to the selected word line WLsel in the read operation of the lower page and a signal STB of the sense amplifier unit SAU. The signal STB is a control signal for reading out data based on the amount of the current flowing through the bit line BL corresponding to the sense amplifier unit SAU.

As described in the example of FIG. 11, the read pass voltage VPASS_READ is first applied to the selected word line WLsel. Subsequently, the voltage applied to the selected word line WLsel is sequentially switched to the read voltages VrA and VrE. In each of the periods when the voltage of the selected word line WLsel is at the read voltages VrA and VrE, the data is read out at the timing when the signal STB is input, and it is confirmed whether the memory cell transistor MT is ON. The voltage of the selected word line WLsel is returned to 0 V (ground voltage Vss) at the end.

As described above, the voltage applied to the selected word line WLsel is set to the read pass voltage VPASS_READ in a first period T1, the read voltages VrA and VrE in the subsequent period T2, and 0 V in the subsequent period T3. The application of the read pass voltage VPASS_READ in the period T1 is performed in order to remove the voltage unevenness in the semiconductor column 338 in advance by turning ON all the memory cell transistors MT in the NAND string NS. As a result, it is possible to prevent an erroneous determination of the threshold voltage in each memory cell transistor MT.

The read operation of the middle page and the upper page is also performed in the same manner as described above. In the read operation of the middle page, the voltage of the selected word line WLsel is switched in order from the read voltages VrB, VrD, and VrF during the period T2 of FIG. 12. Further, in the read operation of the upper page, the voltage of the selected word line WLsel is switched in order from the read voltages VrC and VrG during the period T2 of FIG. 12.

As in the example illustrated in FIG. 12, the read operation may be performed only on a specific page (e.g., a lower page) from a plurality of pages stored by a group of memory cell transistors MT.

Various methods may be applied as a method for the semiconductor memory device 2 to perform a read operation. As a reading method in which data is read only from a specific page by designating the specific page as in the example of FIG. 12, a method called "normal read" and a method called "cache read" described below are available. Further, as a reading method for continuously reading data from a plurality of pages, a method called "sequential read", which will be described later, is also possible.

Figures 13A, 13B, 13C:
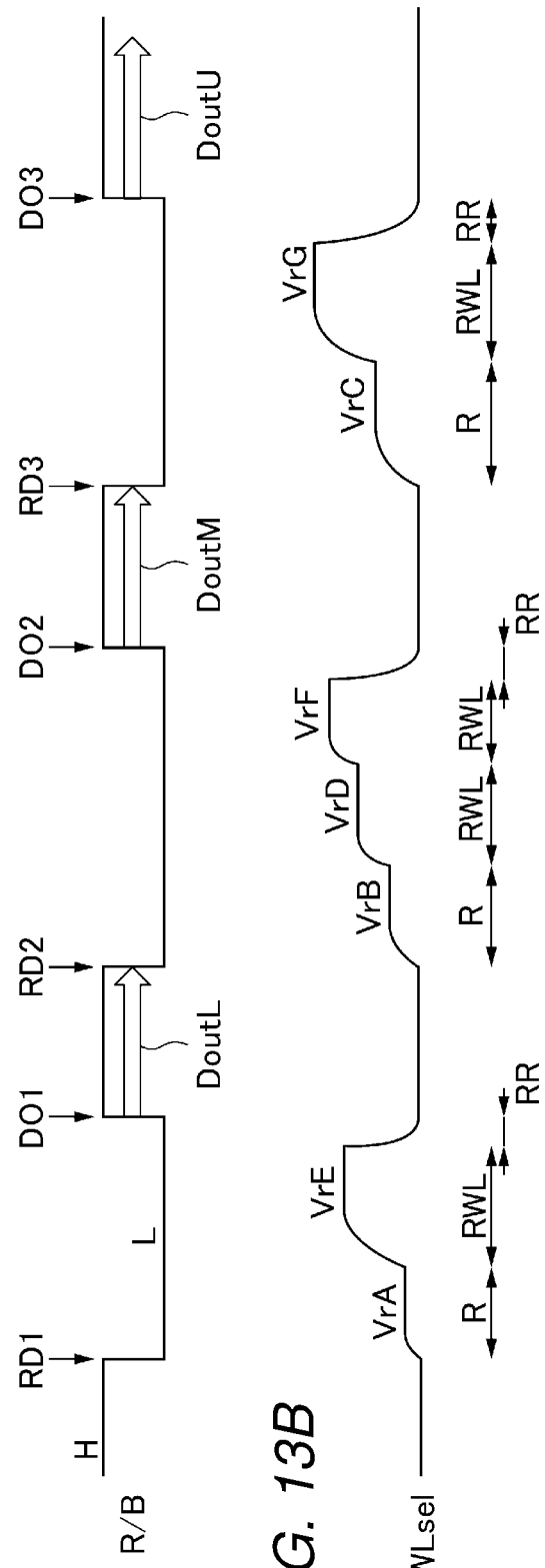
FIGS. 13A to 13C are diagrams illustrating a voltage change of each wiring when normal read is performed.

The normal read will be described with reference to FIGS. 13A to 13C. FIG. 13A illustrates an example of the change in the ready busy signal R/B transmitted from a logic control pad group 32 of the semiconductor memory device 2 to the memory controller 1, with respect to time. The ready busy signal R/B becomes "H (High)" when the semiconductor memory device 2 is in the ready state, and becomes "L (Low)" when the semiconductor memory device 2 is in the busy state. FIG. 13A further illustrates the timing at which commands such as "RD1" and "DO1" are input from the memory controller 1 to the semiconductor memory device 2.

FIG. 13B illustrates an example of the change in the voltage applied to the selected word line WLsel with respect to time. FIG. 13B illustrates how the voltage of the selected word line WLsel is switched between, for example, the read voltages VrA and VrE in the read operation. Further, the voltage of the selected word line WLsel is set to the read pass voltage VPASS_READ in advance during the read operation, for example, as in the period T1 in the example of FIG. 12, but the illustration of such a voltage change is omitted in FIG. 13B.

FIG. 13C illustrates an example of the change in the data stored in the latch circuit XDL of the sense amplifier unit SAU, with respect to time. In the figure, "L" indicates the period during which the lower page data is stored in the latch circuit XDL, "M" indicates the period during which the middle page data is stored in the latch circuit XDL, and "U" indicates the period during which the upper page data is stored in the latch circuit XDL.

In the example illustrated in FIGS. 13A to 13C, a command RD1 is first input from the memory controller 1 to the input/output circuit 21. The command RD1 is a command instructing a read operation of a lower page. For example, the command RD1 is a command set including a command signal instructing the semiconductor memory device 2 to execute a read operation and an address signal indicating an address to be read. Instead of or addition to the address signal, a prefix command (an additional command input prior to an input of a command to instruct execution of a read operation) may be used.

When the command RD1 is input to the input/output circuit 21, the semiconductor memory device 2 changes the ready busy signal R/B from "H" to "L" and starts the read operation of the lower page. As illustrated in FIG. 13B, the sequencer 41 determines the lower page data by switching the voltage of the selected word line WLsel in order of the read voltages VrA and VrE.

Further, the period marked with "R" in FIG. 13B is a period in which the voltage of the selected word line WLsel is set to the read pass voltage VPASS_READ (not illustrated), followed by the first read voltage (e.g., VrA). The period is also referred to as a "setup period R" below. The period marked with "RWL" in FIG. 13B is a period in which the voltage of the selected word line WLsel is set to the next read voltage (e.g., VrE). The period is also referred to as a "read period RWL" below. The read period RWL is basically shorter than the setup period R because the voltage of the selected word line WLsel is not set to the read pass voltage VPASS_READ in advance. The period marked with "RR" in FIG. 13B is a period during which the voltage of the selected word line WLsel is returned to 0 V (voltage Vss). The period is also referred to as a "recovery period RR" below.

As illustrated in FIG. 13C, the lower page data is determined when the read voltage VrE is applied to the selected word line WLsel and the read operation is performed. The determined data is stored in, for example, the latch circuit XDL. As a result, the lower page data may be output from the input/output circuit 21.

When the transfer of the lower page data to the latch circuit XDL is completed and the recovery period RR ends, the semiconductor memory device 2 changes the ready busy signal R/B from "L" to "H". The timing at which the semiconductor memory device 2 changes the ready busy signal R/B from "L" to "H" does not have to be an exact match with the timing at which the transfer of the lower page data to the latch circuit XDL is completed and /or the timing at which the recovery period RR ends. For example, the semiconductor memory device 2 may change the ready busy signal R/B from "L" to "H" at a timing shortly before the transfer of the lower page data to the latch circuit XDL is completed or at a timing shortly before the recovery period RR ends.

When the ready busy signal R/B changes from "L" to "H", the memory controller 1 recognizes that the lower page data may be output from the semiconductor memory device 2. Therefore, immediately after the ready busy signal R/B changes to "H", the command DO1 is input from the memory controller 1 to the input/output circuit 21. For example, the command DO1 is a command set including a command signal instructing the semiconductor memory device 2 to execute a data-out operation and an address signal indicating an address that is the target of the data-out operation.

When the command DO1 is input to the input/output circuit 21, the semiconductor memory device 2 performs a process of outputting the lower page data stored in the latch circuit XDL from the input/output circuit 21 to the memory controller 1. Meanwhile, the ready busy signal R/B remains "H".

When the acquisition of the lower page data by the memory controller 1 is completed, a command RD2 is input from the memory controller 1 to the input/output circuit 21. The command RD2 is a command instructing the read operation of the middle page. For example, the command RD2 is a command set including a command signal instructing the semiconductor memory device 2 to execute a read operation and an address signal indicating an address to be read.

When the command RD2 is input to the input/output circuit 21, the semiconductor memory device 2 changes the ready busy signal R/B from "H" to "L" and starts the read operation of the middle page. As illustrated in FIG. 13B, the sequencer 41 determines the middle page data by switching the voltage of the selected word line WLsel in the order of the read voltages VrB, VrD, and VrF.

Similar to the time of reading the lower page data, the period in which the first read voltage VrB is applied to the selected word line WLsel is a part of the setup period R. Further, each of the periods in which the read voltages VrD and VrF are applied to the selected word line WLsel is the read period RWL, and the recovery period RR follows the final read period RWL.

As illustrated in FIG. 13C, the middle page data is determined when the read voltage VrF is applied to the selected word line WLsel and the read operation is performed. The determined data is stored in, for example, the latch circuit XDL. As a result, the middle page data may be output from the input/output circuit 21. In the example of FIGS. 13A to 13C, when the command RD2 is input to the input/output circuit 21, the lower page data stored in the latch circuit XDL. Instead of such an embodiment, the lower page data may be continuously stored in the latch circuit XDL until the middle page data is transferred to the latch circuit XDL.

When the transfer of the middle page data to the latch circuit XDL is completed and the recovery period RR ends, the semiconductor memory device 2 changes the ready busy signal R/B from "L" to "H". As a result, the memory controller 1 recognizes that the middle page data may be output from the semiconductor memory device 2. Therefore, immediately after the ready busy signal R/B changes to "H", a command DO2 is input from the memory controller 1 to the input/output circuit 21. For example, the command DO2 is a command set including a command signal instructing the semiconductor memory device 2 to execute a data-out operation and an address signal indicating an address that is the target of the data-out operation.

When the command DO2 is input to the input/output circuit 21, the semiconductor memory device 2 performs a process of outputting the middle page data stored in the latch circuit XDL from the input/output circuit 21 to the memory controller 1. Meanwhile, the ready busy signal R/B remains "H".

When the acquisition of the middle page data by the memory controller 1 is completed, a command RD3 is input from the memory controller 1 to the input/output circuit 21. The command RD3 is a command instructing the read operation of the upper page. For example, the command RD3 is a command set including a command signal instructing the semiconductor memory device 2 to execute a read operation and an address signal indicating an address to be read.

When the command RD3 is input to the input/output circuit 21, the semiconductor memory device 2 changes the ready busy signal R/B from "H" to "L" and starts the read operation of the upper page. As illustrated in FIG. 13B, the sequencer 41 determines the upper page data by switching the voltage of the selected word line WLsel in order of the read voltages VrC and VrG.

Similar to the reading of the lower page data, the period in which the first read voltage VrC is applied to the selected word line WLsel is a part of the setup period R. Further, the period in which the read voltage VrG is applied to the selected word line WLsel is the read period RWL, and the recovery period RR follows the final read period RWL.

As illustrated in FIG. 13C, when the read voltage VrG is applied to the selected word line WLsel and the read operation is performed, the upper page data is determined. The determined data is stored in, for example, the latch circuit XDL. As a result, the upper page data may be output from the input/output circuit 21.

When the transfer of the upper page data to the latch circuit XDL is completed and the recovery period RR ends, the semiconductor memory device 2 changes the ready busy signal R/B from "L" to "H". As a result, the memory controller 1 recognizes that the upper page data may be output from the semiconductor memory device 2. Therefore, immediately after the ready busy signal R/B changes to "H", the command DO3 is input from the memory controller 1 to the input/output circuit 21. For example, the command DO1 is a command set including a command signal instructing the semiconductor memory device 2 to execute a data-out operation and an address signal indicating an address that is the target of the data-out operation.

When the command DO3 is input to the input/output circuit 21, the semiconductor memory device 2 performs a process of outputting the upper page data stored in the latch circuit XDL from the input/output circuit 21 to the memory controller 1. Meanwhile, the ready busy signal R/B remains "H".

As described above, in the read operation by the normal read, the operation of determining the specific page data corresponding to the address signal included in the command set is first performed while switching the voltage of the selected word line WLsel. Subsequently, an operation of outputting the data from the input/output circuit 21 to the memory controller 1 is performed. The former operation is also referred to as a "core operation" below, and the latter operation is also referred to as a "Dout operation" below.

In the read operation by the normal read, the core operation and the Dout operation are executed in order for each of the pages specified in the command set. Also, even when normal read command sets are input in order to read data from multiple pages, the operation of reading data from the next page is not started until the operation of reading data from one page has completed. Therefore, as in the example of FIGS. 13A to 13C, when data is continuously read from each of the lower page, the middle page, and the upper page by the normal read, the period required for the memory controller 1 to acquire all the data becomes relatively longer.

In the cache read, by executing a part of the core operation and the Dout operation at the same time, that is, in parallel, it is possible to read a plurality of pieces of page data in a shorter time than the normal read. The cache read will be described with reference to FIGS. 14A to 14D.

Figures 14A, 14B, 14C, 14D:
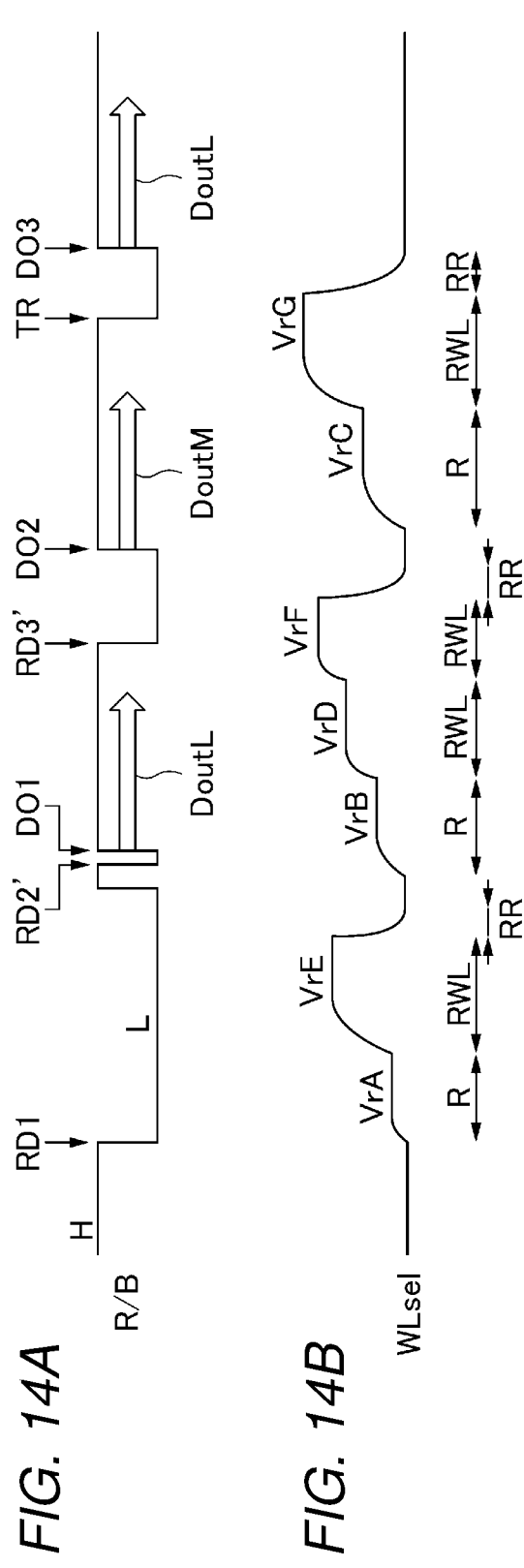
FIGS. 14A to 14D are diagrams illustrating a voltage change of each wiring when cache read is performed.

FIG. 14A illustrates an example of the change in the ready busy signal R/B transmitted from the logic control pad group 32 of the semiconductor memory device 2 to the memory controller 1, with respect to time, in the same manner as in FIG. 13A. FIG. 14B illustrates an example of the change in the voltage applied to the selected word line WLsel with respect to time, in the same manner as in FIG. 13B. FIG. 14C illustrates an example of the change in the data stored in the latch circuit XDL of the sense amplifier unit SAU with respect to time, in the same manner as in FIG. 13C. FIG. 14D illustrates an example of the change in the data stored in the latch circuit ADL of the sense amplifier unit SAU with respect to time, in the same manner as in FIG. 14C.

In the example illustrated in FIGS. 14A to 14D, the command RD1 is first input from the memory controller 1 to the input/output circuit 21 in the same manner as in the example of FIGS. 13A to 13C. In response to the command RD1, the sequencer 41 determines the lower page data by switching the voltage of the selected word line WLsel in order of the read voltages VrA and VrE. The determined lower page data is stored in, for example, the latch circuit ADL and transferred to the latch circuit XDL. When the transfer of the lower page data to the latch circuit XDL is completed and the recovery period RR ends, the semiconductor memory device 2 changes the ready busy signal R/B from "L" to "H". Up to this point, it is the same as the case of the normal read illustrated in FIGS. 13A to 13C.

In the example of FIGS. 14A to 14D, after the ready busy signal R/B changes to "H", a command RD2' is input from the memory controller 1 to the input/output circuit 21. The command RD2' is a command instructing a read operation of the middle page like the command RD2, but is a command instructing a read operation by the cache read. For example, the command RD2' is a command set including a command signal instructing the semiconductor memory device 2 to execute a read operation and an address signal indicating an address to be read.

When the command RD2' is input to the input/output circuit 21, the semiconductor memory device 2 starts the core operation for reading the middle page data.

Specifically, the sequencer 41 switches the voltage of the selected word line WLsel in the order of the read voltages VrB, VrD, and VrF to determine the middle page data.

At the timing when the command RD2' is input to the input/output circuit 21, the semiconductor memory device 2 changes the ready busy signal R/B from "H" to "L". However, since the lower page data may be output from the input/output circuit 21 at this time, the semiconductor memory device 2 changes the ready busy signal R/B from "L" to "H" again immediately after that.

When the ready busy signal R/B changes to "H", the memory controller 1 inputs the command DO1 to the input/output circuit 21.

When the command DO1 is input to the input/output circuit 21, the semiconductor memory device 2 performs a process of outputting the lower page data stored in the latch circuit XDL from the input/output circuit 21 to the memory controller 1. Meanwhile, the ready busy signal R/B remains "H". At this time, the core operation of reading the middle page data is performed in the semiconductor memory device 2. That is, in the cache read of FIGS. 14A to 14D, the Dout operation of outputting the lower page data and the core operation of reading the middle page data are performed in parallel.

When the acquisition of the lower page data by the memory controller 1 is completed, a command RD3' is input from the memory controller 1 to the input/output circuit 21. The command RD3' is a command for instructing a read operation of an upper page like the command RD3, but is a command for instructing a read operation by the cache read. For example, the command RD3' is a command set including a command signal instructing the semiconductor memory device 2 to execute a read operation and an address signal indicating an address to be read.

At the timing when the command RD3' is input to the input/output circuit 21, the semiconductor memory device 2 changes the ready busy signal R/B from "H" to "L". At this time, the semiconductor memory device 2 is performing a core operation of reading the middle page data. Therefore, the sequencer 41 continues to perform the core operation, and the core operation for reading the upper page data does not start at this time.

The middle page data is determined when the read voltage VrF is applied to the selected word line WLsel and the read operation is performed. The determined middle page data is transferred to and stored in the latch circuit ADL.

At the time when the core operation for reading the middle page data is completed, that is, when the voltage of the selected word line WLsel returns from the read voltage VrF to 0 V, in the example of FIGS. 14A to 14D, the output of the lower page data corresponding to the command DO1 has already completed. Therefore, the semiconductor memory device 2 transfers the middle page data from the latch circuit ADL to the latch circuit XDL. When the middle page data is stored in the latch circuit XDL, that is, the middle page data may be output from the input/output circuit 21, the semiconductor memory device 2 changes the ready busy signal R/B from "L" to "H".

As a result, the memory controller 1 recognizes that the middle page data may be output from the semiconductor memory device 2. Therefore, immediately after the ready busy signal R/B changes to "H", a command DO2 is input from the memory controller 1 to the input/output circuit 21.

When the command DO2 is input to the input/output circuit 21, the semiconductor memory device 2 performs a process of outputting the middle page data stored in the latch circuit XDL from the input/output circuit 21 to the memory controller 1. Meanwhile, the ready busy signal R/B remains "H".

After the core operation for reading the middle page data has completed, the sequencer 41 starts the core operation for reading the upper page data in response to the command RD3' input in advance. As illustrated in FIG. 14B, the sequencer 41 determines the upper page data by switching the voltage of the selected word line WLsel in order of the read voltages VrC and VrG. As described above, in the cache read of FIGS. 14A to 14D, the Dout operation for outputting the middle page data and the core operation for reading the upper page data are performed in parallel.

When the acquisition of the middle page data by the memory controller 1 is completed, a command TR is input from the memory controller 1 to the input/output circuit 21. The command TR is a command instructing to transfer the data read by the last read command (the command RD3' in this example) to the latch circuit XDL.

When the command TR is input to the input/output circuit 21, the semiconductor memory device 2 changes the ready busy signal R/B from "H" to "L". At this time, the semiconductor memory device 2 is performing a core operation for reading the upper page data. Therefore, the sequencer 41 continues to perform the core operation, and does not start the process corresponding to the command TR (the process of transferring the upper page data to the latch circuit XDL) at this time.

When the read voltage VrG is applied to the selected word line WLsel and the read operation is performed, the upper page data is determined. The determined upper page data is transferred to and stored in the latch circuit ADL.

At the time when the core operation for reading the upper page data is completed, that is, when the voltage of the selected word line WLsel returns from the read voltage VrG to 0 V, in the example of FIGS. 14A to 14D, the output of the middle page data corresponding to the command DO2 is completed. Therefore, the semiconductor memory device 2 transfers the upper page data from the latch circuit ADL to the latch circuit XDL. When the upper page data is stored in the latch circuit XDL, that is, the upper page data may be output from the input/output circuit 21, the semiconductor memory device 2 changes the ready busy signal R/B from "L" to "H".

As a result, the memory controller 1 recognizes that the upper page data may be output from the semiconductor memory device 2. Therefore, immediately after the ready busy signal R/B changes to "H", the command DO3 is input from the memory controller 1 to the input/output circuit 21.

When the command DO3 is input to the input/output circuit 21, the semiconductor memory device 2 performs a process of outputting the upper page data stored in the latch circuit XDL from the input/output circuit 21 to the memory controller 1. Meanwhile, the ready busy signal R/B remains "H".

As described above, in the read operation by the cache read, the core operation and the Dout operation are performed in parallel for a part of the period. Therefore, when the data is continuously read from each of the lower page, the middle page, and the upper page, the period required for the memory controller 1 to acquire all the data becomes shorter than that in the case of the normal read.

In any of the normal read and the cache read, the core operation is divided into reading data from the lower page, reading data from the middle page, and reading data from the upper page. Therefore, a free time is created between each core operation, and the time required for the entire read operation is extended. Further, since a setup period R is required first in each of the core operations corresponding to each page, the time required for the entire read operation is further extended.

Therefore, in the semiconductor memory device 2 according to the present embodiment, a method called sequential read is also prepared as a method of collectively reading data from a plurality of pages. Prior to the description of the sequential read according to the present embodiment, the sequential read according to the same comparative example as in the related art will be described with reference to FIGS. 15A to 15D. FIGS. 15A to 15D illustrate the change in the voltage of each part with respect to time, in the case where the sequential read of the comparative example is performed in the same manner as in FIGS. 14A to 14D.

In the example illustrated in FIGS. 15A to 15D, the command RD is first input from the memory controller 1 to the input/output circuit 21. The command RD is a command instructing the reading of data from the lower page, the middle page, and the upper page by the sequential read. For example, the command RD is a command set including a command signal instructing the semiconductor memory device 2 to execute a read operation and an address signal indicating an address to be read.

When the command RD is input to the input/output circuit 21, the semiconductor memory device 2 changes the ready busy signal R/B from "H" to "L" and starts a read operation by the sequential read. As illustrated in FIG. 15B, the sequencer 41 switches the voltage of the selected word line WLsel in order from the lowest to the read voltages VrA, VrB, . . . , VrF, and VrG so that the voltage of the selected word line WLsel passes through all the seven read voltages VrA and the like illustrated in FIG. 6. Further, the sequencer 41 acquires data from the selected memory cell transistor MT by performing a read operation in each case where each read voltage is applied to the selected word line WLsel.

In the sequential read, the period during which the first read voltage VrA is applied to the selected word line WLsel is a part of the setup period R. Thereafter, each of the periods in which the read voltages VrB, VrC, . . . , VrG are applied to the selected word line WLsel is a read period RWL, and the recovery period RR follows the final read period RWL. As described above, in the sequential read, the setup period R is only one, and the recovery period RR is also only one.

As described above, the lower page data may be determined by the reading result using the read voltages VrA and VrE. Therefore, in the comparative example of FIGS. 15A to 15D, the lower page data is determined when the read voltage VrE is applied to the selected word line WLsel and the read operation is performed. The determined data is stored in, for example, the latch circuit ADL, and the data is transferred to the latch circuit XDL. As a result, the lower page data may be output from the input/output circuit 21.

When the lower page data may be output from the input/output circuit 21, the semiconductor memory device 2 changes the ready busy signal R/B from "L" to "H". As a result, the memory controller 1 recognizes that the lower page data may be output from the semiconductor memory device 2. Therefore, immediately after the ready busy signal R/B changes to "H", the command DO1 is input from the memory controller 1 to the input/output circuit 21.

When the command DO1 is input to the input/output circuit 21, the semiconductor memory device 2 performs a process of outputting the lower page data stored in the latch circuit XDL from the input/output circuit 21 to the memory controller 1, that is, a Dout operation. Meanwhile, the ready busy signal R/B remains "H". In FIG. 15A, the period during which the Dout operation of the lower page data is performed as described above is denoted as "DoutL".

Even during the period in which the Dout operation is performed as described above, an operation of switching the voltage of the selected word line WLsel is continuously performed. As mentioned above, the middle page data may be determined by the reading result using the read voltages VrB, VrD, and VrF. Therefore, in the comparative example of FIGS. 15A to 15D, the middle page data is determined when the read voltage VrF is applied to the selected word line WLsel and the read operation is performed. The determined middle page data is transferred to and stored in the latch circuit ADL.

Further, the upper page data may be determined by the reading result using the read voltages VrC and VrG. Therefore, in the comparative example of FIGS. 15A to 15D, the upper page data is determined when the read voltage VrG is applied to the selected word line WLsel and the read operation is performed. The determined upper page data is transferred to and stored in the latch circuit ADL.

In the example of FIGS. 15A to 15D, as will be described later, the middle page data is pre-transferred from the latch circuit ADL to the latch circuit XDL before the upper page data is transferred to the latch circuit ADL. Therefore, even when the upper page data is transferred to the latch circuit ADL, the middle page data is not lost. Further, the determined upper page data may be transferred to the latch circuit BDL or the latch circuit CDL instead of the latch circuit ADL so that the Dout operation of each page may be performed at any timing.

When the acquisition of the lower page data by the memory controller 1 (see "DoutL" in FIG. 15A) is completed, the command TR is input from the memory controller 1 to the input/output circuit 21. The command TR is used as a command instructing the semiconductor memory device 2 to transfer the data of the next page (middle page in this example) to the latch circuit XDL.

When the command TR is input to the input/output circuit 21, the semiconductor memory device 2 changes the ready busy signal R/B from "H" to "L". In the example of FIGS. 15A to 15D, the middle page data is determined at this point, and the data is stored in the latch circuit ADL. The sequencer 41 transfers the middle page data from the latch circuit ADL to the latch circuit XDL. When the middle page data is stored in the latch circuit XDL, that is, the middle page data may be output from the input/output circuit 21, the semiconductor memory device 2 changes the ready busy signal R/B from "L" to "H".

As a result, the memory controller 1 recognizes that the middle page data may be output from the semiconductor memory device 2. Therefore, immediately after the ready busy signal R/B changes to "H", a command DO2 is input from the memory controller 1 to the input/output circuit 21.

When the command DO2 is input to the input/output circuit 21, the semiconductor memory device 2 performs a process of outputting the middle page data stored in the latch circuit XDL from the input/output circuit 21 to the memory controller 1, that is, a Dout operation. Meanwhile, the ready busy signal R/B remains "H". In FIG. 15A, the period during which the Dout operation of the middle page data is performed as described above is denoted as "DoutM". In the example of FIGS. 15A to 15D, the core operation is completed before the DoutM operation period is completed.

When the acquisition of the middle page data by the memory controller 1 (see "DoutM" in FIG. 15A) is completed, the command TR is input from the memory controller 1 to the input/output circuit 21. As described above, the command TR is used as a command instructing the semiconductor memory device 2 to transfer the data of the next page (upper page in this example) to the latch circuit XDL.

When the command TR is input to the input/output circuit 21, the semiconductor memory device 2 changes the ready busy signal R/B from "H" to "L". In the example of FIGS. 15A to 15D, the upper page data is determined at this point, and the data is stored in the latch circuit ADL. The sequencer 41 transfers the upper page data from the latch circuit ADL to the latch circuit XDL. When the upper page data is stored in the latch circuit XDL, that is, the upper page data may be output from the input/output circuit 21, the semiconductor memory device 2 changes the ready busy signal R/B from "L" to "H".

As a result, the memory controller 1 recognizes that the upper page data may be output from the semiconductor memory device 2. Therefore, immediately after the ready busy signal R/B changes to "H", the command DO3 is input from the memory controller 1 to the input/output circuit 21.

When the command DO3 is input to the input/output circuit 21, the semiconductor memory device 2 performs a process of outputting the upper page data stored in the latch circuit XDL from the input/output circuit 21 to the memory controller 1, that is, a Dout operation. Meanwhile, the ready busy signal R/B remains "H". In FIG. 15A, the period during which the Dout operation of the upper page data is performed as described above is denoted as "DoutU". When the period is completed, the read operation by the sequential read is completed.

As described above, in the sequential read according to the comparative example, the sequencer 41 switches the voltage of the selected word line WLsel in order from the lowest to the read voltages VrA, VrB, ..., VrF, and VrG. Since the core operation for reading data from each page is executed in a continuous period, there is no free time between the core operations. Further, when reading the data of a plurality of pages, the setup period R may be one time and the recovery period RR may be one time. Therefore, in the sequential read, it is possible to shorten the time required for the core operation in particular.

Further, in the sequential read, the core operation and the Dout operation are executed in parallel for a part of the period. In other words, a part of the period during which the Dout operation is performed is hidden in the period during which the core operation is performed. Therefore, similarly to the cache read, the entire period required for the read operation may be made shorter than that of the normal read.

However, in the sequential read in the example of FIGS. 15A to 15D, the timing at which the first page data (lower page data) may be output from the input/output circuit 21, that is, the timing at which the reading of the data using the read voltage VrE is completed is the final timing in the core operation. Therefore, the period during which the core operation and the Dout operation are executed in parallel is relatively short, and after a relatively long period TM elapses after the core operation is completed, the final Dout operation is completed.

Further, for example, when the period (DoutL) of the Dout operation for outputting data from the lower page becomes longer than that in the example of FIGS. 15A to 15D, after the core operation is completed, the Dout operation that outputs data from the middle page is started. In this case, the period required for the entire read operation to be completed becomes even longer.

FIGS. 16A to 16D illustrate the change in the voltage of each part with respect to time, in the case where the sequential read according to another comparative example is performed in the same manner as in FIGS. 15A to 15D. In this comparative example, the sequencer 41 switches the voltage of the selected word line WLsel in order from the highest to the read voltages VrG, VrF, ..., VrB, and VrA to pass through all the seven read voltages VrA and the like illustrated in FIG. 6.

In this case, the upper page data is first determined at the timing when the reading of the data using the read voltage VrC is completed. Thereafter, the middle page data is determined at the timing when the reading of the data using the read voltage VrB is completed, and the lower page data is determined at the timing when the reading of the data using the read voltage VrA is completed. Also, in this example, the timing at which the first page data (upper page data) may be output from the input/output circuit 21 is the timing at the end of the core operation. Therefore, the period TM from the end of the core operation to the end of the final Dout operation is relatively long as in the example of FIGS. 15A to 15D.

Therefore, in the sequential read executed according to the present embodiment, by changing the order of the voltages applied to the selected word line WLsel to a different order from the case of the above-described comparative examples, the above period TM is shortened and the entire period required for the read operation is shortened.

A mode of sequential read executed according to the present embodiment will be described with reference to FIGS. 17A to 17F. FIG. 17A illustrates an example of the change in the ready busy signal R/B transmitted from the logic control pad group 32 of the semiconductor memory device 2 to the memory controller 1, with respect to time, in the same manner as in FIG. 15A. FIG. 17B illustrates an example of the change in the voltage applied to the selected word line WLsel with respect to time, in the same manner as in FIG. 15B. FIG. 17C illustrates an example of the change in the data stored in the latch circuit XDL of the sense amplifier unit SAU with respect to time, in the same manner as in FIG. 15C. FIG. 17D illustrates an example of the change in the data stored in the latch circuit ADL of the sense amplifier unit SAU with respect to time, in the same manner as in FIG. 15D. FIG. 17E illustrates an example of the change in the data stored in the latch circuit BDL of the sense amplifier unit SAU with respect to time, in the same manner as in FIG. 17D. FIG. 17F illustrates an example of the change in the data stored in the latch circuit CDL of the sense amplifier unit SAU with respect to time, in the same manner as in FIG. 17D.

In the example of FIGS. 17A to 17F, the command RD is first input from the memory controller 1 to the input/output circuit 21 as in the example of FIGS. 15A to 15D. When the command RD is input, the semiconductor memory device 2 changes the ready busy signal R/B from "H" to "L", and starts a read operation by the sequential read. As illustrated in FIG. 17B, the sequencer 41 switches the voltage of the selected word line WLsel in the order of the read voltages VrA, VrE, VrB, VrD, VrF, VrC, and VrG so that the voltage of the selected word line WLsel passes through all the seven read voltages VrA and the like illustrated in FIG. 6. Further, the sequencer 41 acquires data from the selected memory cell transistor MT by performing a read operation in each case where each read voltage is applied to the selected word line WLsel.

As illustrated in FIG. 17B, the period during which the core operation is performed, that is, the period during which the voltage of the selected word line WLsel is switched, may be divided into three short periods, that is, TML, TMM, and TMU. In the first short period TML, the voltage of the selected word line WLsel is switched in the order of the read voltages VrA and VrE. In the next short period TMM, the voltage of the selected word line WLsel is switched in the order of the read voltages VrB, VrD, and VrF. In the final short period TMU, the voltage of the selected word line WLsel is switched in the order of the read voltages VrC and VrG.

The read voltages VrA and VrE applied to the selected word line WLsel in the short period TML are both voltages required to determine the lower page data. In the short period TML, all the read voltages VrA and the like required to determine the lower page data are applied to the selected word line WLsel, while the read voltages VrB and the like required to determine the data other than the lower page data are not applied to the selected word line WLsel. Therefore, at the timing when the short period TML ends, the lower page data is determined at an early stage. As described above, the short period TML is a period in which the voltage required for reading the lower page data is applied to the selected word line WLsel, and may be said to be a "short period corresponding to the lower page".

The read voltages VrB, VrD, and VrF applied to the selected word line WLsel in the short period TMM are all voltages required to determine the middle page data. In the short period TMM, all the read voltages VrB and the like required to determine the middle page data are applied to the selected word line WLsel, while the read voltages VrA and the like required to determine the data other than the middle page data are not applied to the selected word line WLsel. Therefore, at the timing when the short period TMM ends, the middle page data is determined following the lower page data. As described above, the short period TMM is a period in which the voltage required for reading the middle page data is applied to the selected word line WLsel, and may be said to be a "short period corresponding to the middle page".

The read voltages VrC and VrG applied to the selected word line WLsel in the short period TMU are both voltages required to determine the upper page data. In the short period TMU, all the read voltages VrC and the like required to determine the upper page data are applied to the selected word line WLsel, while the read voltages VrA and the like required to determine the data other than the upper page data are not applied to the selected word line WLsel. Therefore, at the timing when the short period TMU ends, the upper page data is determined following the lower page data and the middle page data. As described above, the short period TMU is a period in which the voltage required for reading the upper page data is applied to the selected word line WLsel, and may be said to be a "short period corresponding to the upper page".

When the short period TML ends and the lower page data is determined, the determined lower page data is stored in the latch circuit ADL. When the lower page data stored in the latch circuit ADL is transferred to the latch circuit XDL, the semiconductor memory device 2 changes the ready busy signal R/B from "L" to "H". As a result, the memory controller 1 recognizes that the lower page data may be output from the semiconductor memory device 2. Therefore, immediately after the ready busy signal R/B changes to "H", the command DO1 is input from the memory controller 1 to the input/output circuit 21. FIG. 17D illustrates how the data in the latch circuit ADL is erased after the lower page data is transferred from the latch circuit ADL to the latch circuit XDL. However, even after the lower page data is transferred from the latch circuit ADL to the latch circuit XDL, the lower page data may be maintained in the latch circuit ADL.

When the command DO1 is input to the input/output circuit 21, the semiconductor memory device 2 performs a process of outputting the lower page data stored in the latch circuit XDL from the input/output circuit 21 to the memory controller 1, that is, a Dout operation. Meanwhile, the ready busy signal R/B remains "H". At this time, in the semiconductor memory device 2, the core operation is continuously performed in the short period TMM. In FIG. 17A, the period during which the Dout operation of the lower page data is performed as described above is denoted as "DoutL" as in the case of FIG. 15A.

When the acquisition of the lower page data (DoutL) by the memory controller 1 is completed, the command TR is input from the memory controller 1 to the input/output circuit 21. This command TR is used as a command instructing the semiconductor memory device 2 to transfer the data of the next page (middle page in this example) to the latch circuit XDL.

When the command TR is input to the input/output circuit 21, the semiconductor memory device 2 changes the ready busy signal R/B from "H" to "L". In the example of FIGS. 17A to 17F, the middle page data has not been determined yet at this time, and it is in the middle of the short period TMM. Therefore, the transfer of the middle page data to the latch circuit XDL is not performed at this time.

After that, when the short period TMM ends and the middle page data is determined, the determined middle page data is stored in the latch circuit BDL. At this timing, when the command TR has already been input from the memory controller 1 as in the present embodiment, the semiconductor memory device 2 transfers the middle page data from the latch circuit BDL to the latch circuit XDL. When the middle page data is stored in the latch circuit XDL, that is, the middle page data may be output from the input/output circuit 21, the semiconductor memory device 2 changes the ready busy signal R/B from "L" to "H". FIG. 17E illustrates how the data in the latch circuit BDL is erased after the middle page data is transferred from the latch circuit BDL to the latch circuit XDL. However, even after the middle page data is transferred from the latch circuit BDL to the latch circuit XDL, the middle page data may be stored in the latch circuit BDL.

As a result, the memory controller 1 recognizes that the middle page data may be output from the semiconductor memory device 2. Therefore, immediately after the ready busy signal R/B changes to "H", a command DO2 is input from the memory controller 1 to the input/output circuit 21.

When the command DO2 is input to the input/output circuit 21, the semiconductor memory device 2 performs a process of outputting the middle page data stored in the latch circuit XDL from the input/output circuit 21 to the memory controller 1, that is, a Dout operation. Meanwhile, the ready busy signal R/B remains "H". At this time, in the semiconductor memory device 2, the core operation is continuously performed in the short period TMU. In FIG. 17A, the period during which the Dout operation of the middle page data is performed as described above is denoted as "DoutM" as in the case of FIG. 15A.

When the acquisition of the middle page data (DoutM) by the memory controller 1 is completed, a command TR is input from the memory controller 1 to the input/output circuit 21. This command TR is used as a command instructing the semiconductor memory device 2 to transfer the data of the next page (upper page in this example) to the latch circuit XDL.

When the command TR is input to the input/output circuit 21, the semiconductor memory device 2 changes the ready busy signal R/B from "H" to "L". In the example of FIGS. 17A to 17F, the upper page data has not been determined yet at this time, and it is in the middle of the short period TMU. Therefore, the transfer of the upper page data to the latch circuit XDL is not performed at this time.

After that, when the short period TMU ends and the upper page data is determined, the determined upper page data is stored in the latch circuit CDL. At this timing, when the command TR has already been input from the memory controller 1 as in the present embodiment, the semiconductor memory device 2 transfers the upper page data from the latch circuit CDL to the latch circuit XDL. When the upper page data is stored in the latch circuit XDL, that is, the upper page data may be output from the input/output circuit 21, the semiconductor memory device 2 changes the ready busy signal R/B from "L" to "H". Further, FIG. 17F illustrates how the data in the latch circuit CDL is erased after the upper page data is transferred from the latch circuit CDL to the latch circuit XDL. However, even after the upper page data is transferred from the latch circuit CDL to the latch circuit XDL, the upper page data may be stored in the latch circuit CDL.

As a result, the memory controller 1 recognizes that the upper page data may be output from the semiconductor memory device 2. Therefore, immediately after the ready busy signal R/B changes to "H", the command DO3 is input from the memory controller 1 to the input/output circuit 21.

When the command DO3 is input to the input/output circuit 21, the semiconductor memory device 2 performs a process of outputting the upper page data stored in the latch circuit XDL from the input/output circuit 21 to the memory controller 1, that is, a Dout operation. Meanwhile, the ready busy signal R/B remains "H". In FIG. 17A, the period during which the Dout operation of the upper page data is performed as described above is denoted as "DoutU" as in the case of FIG. 15A.

When the short period TMU ends, the sequencer 41 returns the voltage of the selected word line WLsel from the read voltage VrG to 0 V (voltage Vss). That is, the recovery period RR follows the short period TMU. After the recovery period RR is completed, the acquisition of the upper page data (DoutU) by the memory controller 1 is completed.

As described above, in the semiconductor memory device 2 according to the present embodiment, when the input/output circuit 21 receives the command RD, the sequencer 41 switches the voltage of the selected word line WLsel in each of the short periods TML, TMM, and TMU corresponding to each page to be read, thereby performing a process of determining the data on the page corresponding to each short period. In each of the short periods TML, TMM, and TMU, the sequencer 41 switches the voltage of the selected word line WLsel to pass all the voltages required to determine the data on the page corresponding to the short period, while not switching the voltage of the selected word line WLsel to the voltage required to determine the data on a page different from the page corresponding to the short period.

Further, in the present embodiment, each time the data of a part of the lower page, the middle page, and the upper page is determined, the sequencer 41 stores the data in the latch circuit XDL so that the data may be output from the input/output circuit 21. As a result, the sequencer 41 may perform at least a part of the process of outputting data from the input/output circuit 21 (i.e., Dout operation) in parallel with the process of switching the voltage of the selected word line WLsel (i.e., core operation).

In the sequential read performed by such a method, the first page data (lower page data) may be output from the input/output circuit 21 at a relatively early timing after the core operation is started.

Since the Dout operation is started at a timing earlier than that of the comparative example, in the present embodiment, both the period of the Dout operation (DoutL) for outputting data from the lower page and the period of the Dout operation (DoutM) for outputting data from the middle page are hidden in the period during which the core operation is performed. As a result, the period TM from the end of the core operation to the end of the final Dout operation becomes shorter than that of the comparative example, so that the time required for the entire read operation is shortened.

The time required to continuously read the lower page data, the middle page data, and the upper page data will be described with reference to FIGS. 18A to 18D. FIG. 18A illustrates an example of the time required for the normal read of FIGS. 13A to 13C. The "CORE OPERATION" illustrated in the figures is the total time of the core operation executed by the normal read. As illustrated in FIGS. 13A to 13C, the period during which the normal read core operation is performed includes three setup periods R, four read periods RWL, and three recovery periods RR. The total time of the core operation when the normal read is performed is the sum of those periods as illustrated in FIG. 18A.

The "Dout OPERATION" illustrated in FIG. 18A is the total time of the portion executed in the period not overlapping with the core operation among the Dout operations executed by the normal read. In the normal read, the entire Dout operation is executed during a period that does not overlap with the core operation. Therefore, the "Dout operation" illustrated in FIG. 18A is equal to the total time of the Dout operation executed by the normal read.

FIG. 18B illustrates an example of the time required for the cache read of FIGS. 14A to 14D. The definitions of "CORE OPERATION" and "Dout OPERATION" illustrated in the figures are the same as above. The period during which the core operation of the cache read is performed also includes three setup periods R, four read periods RWL, and one recovery period RR, as in the case of normal read. Therefore, the total time of the core operation when the cache read is performed is the sum of those periods as illustrated in FIG. 18B. This is equivalent to the time of the core operation in the normal read illustrated in FIG. 18A.

Meanwhile, a part of the Dout operation executed by the cache read is executed in parallel with the core operation. Therefore, as illustrated in FIG. 18B, the time required for the cache read becomes shorter than the time required for the normal read in FIG. 18A.

FIG. 18C illustrates an example of the time required for sequential read according to the comparative example of FIGS. 15A to 15D. As illustrated in FIGS. 15A to 15D, the period during which the core operation of the sequential read according to the comparative example is performed includes one setup period R, six read periods RWL, and one recovery period RR. Therefore, as illustrated in FIG. 18C, the total time of the core operation when the sequential read according to the comparative example is performed becomes shorter than the time of the core operation in the normal read illustrated in FIG. 18A.

A part of the Dout operation executed by the sequential read according to the comparative example is executed in parallel with the core operation. The length of the period during which both operations are executed in parallel may vary depending on the conditions. However, as illustrated in FIG. 18C, the total time of the portion executed in the period not overlapping with the core operation becomes shorter than the time of the Dout operation in the normal read illustrated in FIG. 18A.

FIG. 18D illustrates an example of the time required for the sequential read according to the present embodiment of FIGS. 17A to 17F. As illustrated in FIGS. 17A to 17F, the period during which the core operation of the sequential read according to the present embodiment is performed also includes one setup period R, six read periods RWL, and one recovery period RR, as in the case of the comparative example. Therefore, as illustrated in FIG. 18D, the total time of the core operation when the sequential read according to the present embodiment is performed becomes shorter than the time of the core operation in the normal read illustrated in FIG. 18A.

In the sequential read according to the present embodiment, the Dout operation for two out of three times is executed in parallel with the core operation. As a result, as illustrated in FIG. 18D, the total time of the portion of the Dout operation executed during the period that does not overlap with the core operation becomes shorter than the time of the Dout operation in the sequential read according to the comparative example illustrated in FIG. 18C.

As described above, in the sequential read according to the present embodiment, the time required for the entire read operation may be minimized as compared with other methods. Each time described above is merely an example and may change depending on the conditions. However, when the reading methods are compared after arranging the conditions such as the time required for the Dout operation, the required time for sequential reading according to the present embodiment is the shortest as illustrated in the example of FIGS. 18A to 18D.

In the present embodiment, when the input/output circuit 21 receives the command RD from the memory controller 1, the sequencer 41 executes the sequential read illustrated in FIGS. 17A to 17F. As described above, the command RD is a command for continuously reading all pages stored in the memory cell transistor MT, that is, lower page, middle page, and upper page data. Instead of such an embodiment, even when the input/output circuit 21 receives a command to continuously read a part of plural pages instead of all the lower page, the middle page, and the upper page, a sequential read similar to the present embodiment may be executed.

For example, when the input/output circuit 21 receives a command to continuously execute only the lower page and the middle page, the sequencer 41 may determine the lower data and the middle data in order while applying the read voltages VrA, VrE, VrB, VrD, and VrF to the selected word line WLsel in order. Further, for example, when the input/output circuit 21 receives a command to continuously execute only the middle page and the upper page, the sequencer 41 may determine the middle data and the upper data in order while applying the read voltages VrB, VrD, VrF, VrC, and VrG to the selected word line WLsel in order. In any case, the command for instructing a sequential read from the memory controller 1 may be a command instructing an operation of continuously reading data of a plurality of pages from the memory cell transistor MT. As a result, it is possible to start the Dout operation for the first page data at a timing earlier than that of the related art after the core operation is started.

A second embodiment will be described. Hereinafter, the points different from the first embodiment will be mainly described, and the points common to the first embodiment will be omitted as appropriate.

FIGS. 19A to 19F illustrate the change in the voltage of each part with respect to time, when the sequential read of the present embodiment is performed in the same manner as in FIGS. 17A to 17F. As is clear from the comparison of FIGS. 19A to 19F with FIGS. 17A to 17F, the present embodiment is different from the first embodiment in the order in which each read voltage VrA or the like is applied to the selected word line WLsel at the time of sequential reading.

In the first short period TML, the sequencer 41 switches the voltage applied to the selected word line WLsel to change in the order of read voltages VrE and VrA, thereby determining the lower page data. In the short period TMM following the short period TML, the sequencer 41 switches the voltage applied to the selected word line WLsel to change the read voltages VrF, VrD, and VrB in this order, thereby determining the middle page data. In the short period TMU following the short period TMM, the sequencer 41 switches the voltage applied to the selected word line WLsel in the order of the read voltages VrG and VrC, thereby determining the upper page data.

In this way, in any of the short periods TML, TMM, and TMU, the sequencer 41 switches the voltage of the selected word line WLsel to be gradually reduced.

Although not illustrated in FIG. 19B, in the setup period R to which the first read voltage VrE is applied in the short period TML, the read pass voltage VPASS_READ is first applied to the selected word line WLsel, followed by the read voltage VrE.

The read pass voltage VPASS_READ is a voltage larger than any of the read voltages VrA to VrG. Therefore, when the read voltage VrE is applied after the read pass voltage VPASS_READ as in the present embodiment, the read voltage value may reach the target value earlier than in the case where the read voltage VrA is applied after the read pass voltage VPASS_READ as in the first embodiment. That is, the length of the setup period R may be shortened as compared with the first embodiment.

As described above, in the present embodiment, the sequencer 41 is configured to gradually reduce the voltage of the selected word line WLsel in the first short period TML after the input/output circuit 21 receives the command RD. As a result, the setup period R is shortened, so that the entire read operation may be completed in a shorter time.

A third embodiment will be described. Hereinafter, the points different from the above-mentioned second embodiment will be mainly described, and the points common to the second embodiment will be omitted as appropriate.

FIGS. 20A to 20F illustrate the change in the voltage of each part with respect to time, when the sequential read of the present embodiment is performed in the same manner as in FIGS. 19A to 19F. Similar to the second embodiment, this embodiment is also different from the first embodiment in the order in which each read voltage VrA or the like is applied to the selected word line WLsel at the time of sequential read.

In the first short period TML, the order of the read voltages applied to the selected word line WLsel is the same as in the second embodiment. Further, in the short periods TMM and TMU, the order of the read voltages applied to the selected word line WLsel is the same as that of the first embodiment.

As described above, in the present embodiment, the sequencer 41 is configured to gradually reduce the voltage of the selected word line WLsel only in the first short period TML including the setup period R. The short period in which the voltage of the selected word line WLsel is gradually reduced may be only a part of the short period TML as in the present embodiment, or all the short periods TML, TMM, and TMU as in the second embodiment. However, in order to obtain the effect of shortening the setup period R, it is preferable that the voltage of the selected word line WLsel is gradually reduced at least in the first short period.

A fourth embodiment will be described. Hereinafter, the points different from the first embodiment will be mainly described, and the points common to the first embodiment will be omitted as appropriate.

FIGS. 21A to 21F illustrate the change in the voltage of each part with respect to time, when the sequential read of the present embodiment is performed in the same manner as in FIGS. 17A to 17F. This embodiment is also different from the first embodiment in the order in which each read voltage VrA or the like is applied to the selected word line WLsel at the time of sequential read.

In the first short period TML, the order of the read voltages applied to the selected word line WLsel is the same as in the second embodiment. Further, in the short period TMM, the order of the read voltages applied to the selected word line WLsel is the same as that of the first embodiment. In the short period TMU, the order of the read voltages applied to the selected word line WLsel is the same as in the second embodiment. Therefore, the voltage applied to the selected word line WLsel is switched in the order of read voltages VrE, VrA, VrB, VrD, VrF, VrG, and VrC.

In the present embodiment as well as in the second embodiment, the voltage of the selected word line WLsel is gradually reduced in the first short period TML. This has the effect of shortening the setup period R.

Further, in the present embodiment, while obtaining the above effect of shortening the setup period R, a period in which the read voltage is gradually increased, that is, a period in which the read voltage is switched in the order of VrA, VrB, VrD, VrF, and VrG is secured as long as possible. As a result, the read voltage may be settled at each value of VrB, VrD, VrF, and VrG at an early stage, so that the entire read operation may be completed in a shorter time.

A fifth embodiment will be described. Hereinafter, the points different from the first embodiment will be mainly described, and the points common to the first embodiment will be omitted as appropriate.

FIGS. 22A to 22F illustrate the change in the voltage of each part with respect to time, when the sequential read of the present embodiment is performed in the same manner as in FIGS. 17A to 17F. This embodiment is also different from the first embodiment in the order in which each read voltage VrA or the like is applied to the selected word line WLsel at the time of sequential read.

In the present embodiment, the voltage applied to the selected word line WLsel is switched in the order of read voltages VrG, VrC, VrB, VrD, VrF, VrE, and VrA. In the present embodiment, the sequencer 41 is configured to switch the voltage applied to the selected word line WLsel so that the first short period is the short period TMU for determining the upper data, the subsequent short period is the short period TMM for determining the middle data, and the last short period is the short period TML for determining the lower data.

In the present embodiment, since the data is determined in the order of the upper page, the middle page, and the lower page in the core operation, the data output by the Dout operation is also performed in this order. In this way, the order in which the data on each page is read may be changed as appropriate.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure. For example, as illustrated in FIGS. 23A to 23F, the sequential read operation may be performed twice or more in a row. In this case, unlike the command RD1 instructing the first sequential read operation, the command RD2' instructing the second sequential read operation may be a command instructing a read operation by the cache read as in the comparative example illustrated in FIGS. 14A to 14D.

What is claimed is:

1. A semiconductor memory device comprising:
a memory cell array including a plurality of memory cell transistors;
a word line connected to a gate of each of the memory cell transistors;
a control circuit configured to control an operation of the memory cell array; and
an input circuit, wherein
when the input circuit receives a command instructing an operation of continuously reading data of a plurality of pages from the memory cell transistors, the control circuit determines the data of the plurality of pages by continuously applying read voltages corresponding to the plurality of pages to be read over a first time period, to the word line, and
in each continuous time period that is within the first time period and during which the control circuit applies read voltages for determining the data of one of the plurality of pages to the word line, the control circuit does not apply a read voltage for determining the data of any other of the plurality of pages to the word line.

2. The semiconductor memory device according to claim 1, further comprising an output circuit configured to output data,
wherein, the control circuit makes the data of one of the pages available for output from the output circuit while applying read voltages for determining the data of another one of the pages to the word line.

3. The semiconductor memory device according to claim 2, wherein the control circuit performs at least a part of a process of outputting data from the output circuit in parallel with a process of applying the read voltages to the word line.

4. The semiconductor memory device according to claim 1, wherein
- the plurality of memory cell transistors are each programmable to store two or more bits of data including at least a first bit, a value of which can be determined using a first set of read voltages, and a second bit, a value of which can be determined using a second set of read voltages, and the plurality of pages include a first page associated with the first bits stored in the plurality of memory cell transistors and a second page associated with the second bits stored in the plurality of memory cell transistors, and
- the control circuit is configured to read the first page by applying the first set of read voltages to the word line during a second time period that is within the first time period, and to read the second page by applying the second set of read voltages to the word line during a third time period that is within the first time period and directly follows the second time period.

5. The semiconductor memory device according to claim 4, wherein
- the plurality of memory cell transistors are each programmable to store three or more bits of data further including a third bit, a value of which can be determined using a third set of read voltages, and the plurality of pages further include a third page associated with the third bits stored in the plurality of memory cell transistors, and
- the control circuit is configured to read the third page by applying the third set of read voltages to the word line during a fourth time period that is within the first time period and directly follows the third time period.

6. The semiconductor memory device according to claim 5, wherein the control circuit applies a read pass voltage higher than a highest read voltage in the first, second, and third sets, to the word line prior to the second time period.

7. The semiconductor memory device according to claim 6, wherein the read voltages in the first set includes a first read voltage and a second read voltage that is higher than the first read voltage and applied to the word line after the first read voltage.

8. The semiconductor memory device according to claim 6, wherein the read voltages in the first set includes a first read voltage and a second read voltage that is lower than the first read voltage and applied to the word line after the first read voltage.

9. The semiconductor memory device according to claim 8, wherein the read voltages in the second set includes a third read voltage, a fourth read voltage that is lower than the third read voltage and applied to the word line after the third read voltage, and a fifth read voltage that is lower than the fourth read voltage and applied to the word line after the fourth read voltage.

10. The semiconductor memory device according to claim 8, wherein the read voltages in the second set includes a third read voltage, a fourth read voltage that is higher than the third read voltage and applied to the word line after the third read voltage, and a fifth read voltage that is higher than the fourth read voltage and applied to the word line after the fourth read voltage.

11. The semiconductor memory device according to claim 10, wherein the read voltages in the third set includes a sixth read voltage that is lower than the fifth read voltage and a seventh read voltage that is higher than the sixth read voltage and applied to the word line after the sixth read voltage.

12. The semiconductor memory device according to claim 10, wherein the read voltages in the third set includes a sixth read voltage that is higher than the fifth read voltage and a seventh read voltage that is lower than the sixth read voltage and applied to the word line after the sixth read voltage.

13. A sequential read method for a semiconductor memory device comprising a memory cell array including a plurality of memory cell transistors and a word line connected to a gate of each of the memory cell transistors, said method comprising:
- in response to a command to read data of a plurality of pages, continuously applying read voltages corresponding to the plurality of pages to be read over a first time period, to the word line, to determine the data of the plurality of pages, wherein
- in each continuous time period that is within the first time period and during which the read voltages for determining the data of one of the plurality of pages are applied to the word line, no read voltage for determining the data of any other of the plurality of pages is applied to the word line.

14. The method according to claim 13, further comprising:
- outputting data from the output circuit while applying the read voltages to the word line.

15. The method according to claim 13, wherein the plurality of memory cell transistors each have been programmed to store two or more bits of data including at least a first bit, a value of which can be determined using a first set of read voltages, and a second bit, a value of which can be determined using a second set of read voltages, and the plurality of pages include a first page associated with the first bits stored in the plurality of memory cell transistors and a second page associated with the second bits stored in the plurality of memory cell transistors, and wherein the step of continuously applying the read voltages includes:
- applying the first set of read voltages to the word line during a second time period that is within the first time period to read the first page; and
- applying the second set of read voltages to the word line during a third time period that is within the first time period and directly follows the second time period.

16. The method according to claim 15, wherein the plurality of memory cell transistors each have been programmed to store three or more bits of data further including a third bit, a value of which can be determined using a third set of read voltages, and the plurality of pages further include a third page associated with the third bits stored in the plurality of memory cell transistors, and wherein the step of continuously applying the read voltages further includes:
- applying the third set of read voltages to the word line during a fourth time period that is within the first time period and directly follows the third time period.

17. The method according to claim 16, further comprising:
- applying a read pass voltage higher than a highest read voltage in the first, second, and third sets, to the word line prior to the second time period.

18. The method according to claim 17, wherein the read voltages in the first set includes a first read voltage and a second read voltage that is higher than the first read voltage and applied to the word line after the first read voltage.

19. The method according to claim 17, wherein the read voltages in the first set includes a first read voltage and a second read voltage that is lower than the first read voltage and applied to the word line after the first read voltage.

20. The method according to claim 19, wherein the read voltages are continuously increased at least three times after the second read voltage is applied to the word line.

* * * * *